(12) United States Patent
Kim et al.

(10) Patent No.: US 7,964,499 B2
(45) Date of Patent: Jun. 21, 2011

(54) METHODS OF FORMING SEMICONDUCTOR SOLAR CELLS HAVING FRONT SURFACE ELECTRODES

(75) Inventors: Yun-Gi Kim, Gyeonggi-do (KR); Sang-Ho Kim, Seoul (KR); Doo-Youl Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 114 days.

(21) Appl. No.: 12/437,595

(22) Filed: May 8, 2009

(65) Prior Publication Data
US 2009/0286347 A1 Nov. 19, 2009

Related U.S. Application Data

(60) Provisional application No. 61/054,233, filed on May 19, 2008, provisional application No. 61/058,322, filed on Jun. 3, 2008.

(30) Foreign Application Priority Data

May 13, 2008 (KR) .......................... 10-2008-44062
May 28, 2008 (KR) .......................... 10-2008-49772

(51) Int. Cl.
*H01L 21/44* (2006.01)
*H01L 31/00* (2006.01)

(52) U.S. Cl. ......... 438/652; 257/E31.124; 257/E21.476; 136/252

(58) Field of Classification Search .................. 136/256, 136/243, 252, 258; 438/72, 2, 98, 203, 666, 438/652.578; 257/466, 436, E31.124, E21.471, 257/E21.476
See application file for complete search history.

(56) References Cited

U.S. PATENT DOCUMENTS

| | | | |
|---|---|---|---|
| 4,328,260 A | 5/1982 | Whitehouse | |
| 4,726,850 A | 2/1988 | Wenham et al. | |
| 4,748,130 A | 5/1988 | Wenham et al. | |
| 6,084,175 A * | 7/2000 | Perry et al. ..................... | 136/256 |
| 6,524,880 B2 | 2/2003 | Moon et al. | |
| 6,639,143 B2 | 10/2003 | Kim et al. | |
| 6,663,944 B2 | 12/2003 | Park et al. | |
| 6,696,739 B2 | 2/2004 | Lee et al. | |
| 7,226,182 B2 | 6/2007 | Kim | |
| 7,335,555 B2 | 2/2008 | Gee et al. | |
| 2002/0084503 A1 | 7/2002 | Lee et al. | |
| 2002/0119290 A1 | 8/2002 | Park et al. | |
| 2002/0153039 A1 | 10/2002 | Moon et al. | |
| 2003/0172969 A1 | 9/2003 | Jenson et al. | |
| 2005/0016582 A1 | 1/2005 | Lee et al. | |

(Continued)

FOREIGN PATENT DOCUMENTS
JP   2001-203376   7/2001

*Primary Examiner* — Thomas L Dickey
*Assistant Examiner* — Nikolay Yushin
(74) *Attorney, Agent, or Firm* — Cantor Colburn LLP

(57) ABSTRACT

Solar cells include a substrate having a light collecting surface thereon and a P-N rectifying junction within the substrate. The P-N rectifying junction includes a base region of first conductivity type (e.g., p-type) and a semiconductor layer of second conductivity type extending between the base region and the light collecting surface. A trench is also provided, which extends through the semiconductor layer and into the base region. First and second electrodes are provided adjacent the light collecting surface. The first electrode is electrically coupled to the semiconductor layer and the second electrode is electrically coupled to the base region, at a location adjacent a bottom of the trench.

23 Claims, 51 Drawing Sheets

U.S. PATENT DOCUMENTS

| | | |
|---|---|---|
| 2005/0126627 A1 | 6/2005 | Hayashida |
| 2005/0189015 A1 | 9/2005 | Rohatgi et al. |
| 2005/0279402 A1 | 12/2005 | Ahn et al. |
| 2007/0095390 A1 | 5/2007 | Ahn et al. |
| 2007/0107775 A1 | 5/2007 | Choi et al. |
| 2007/0119498 A1 | 5/2007 | Park et al. |
| 2007/0119499 A1 | 5/2007 | Shin et al. |
| 2007/0125421 A1 | 6/2007 | Park et al. |
| 2007/0157965 A1 | 7/2007 | Park |
| 2007/0175508 A1 | 8/2007 | Park |
| 2007/0235075 A1 | 10/2007 | Park |
| 2007/0238216 A1 | 10/2007 | Park |
| 2007/0290283 A1 | 12/2007 | Park et al. |
| 2008/0251117 A1 | 10/2008 | Schubert et al. |

* cited by examiner

METHODS OF FORMING SEMICONDUCTOR SOLAR CELLS HAVING FRONT SURFACE ELECTRODES

REFERENCE TO PRIORITY APPLICATIONS

This application claims priority to U.S. Provisional Application Ser. Nos. 61/054,233, filed May 19, 2008, and 61/058,322, filed Jun. 3, 2008, and to Korean Patent Application Serial Nos. 2008-44062, filed May 13, 2008, and 2008-49772, filed May 28, 2008, the disclosures of which are hereby incorporated herein by reference.

REFERENCE TO RELATED APPLICATION

This application is related to U.S. application Ser. No. 12/437,583, filed May 8, 2009 entitled "Methods of Forming Semiconductor Solar Cells Having Front Surface Electrodes," the disclosure of which is hereby incorporated herein by reference.

FIELD OF THE INVENTION

The present invention relates to solar cells and methods of forming same and, more particularly, to semiconductor solar cells and methods of forming same.

BACKGROUND OF THE INVENTION

A solar cell is a device that converts solar energy (e.g., sunlight) into electricity. Solar cells have many applications. Individual cells may be used for powering small devices, whereas large arrays of cells (e.g., photovoltaic arrays) may be used to generate a form of renewable energy, which may be particularly useful in situations where electrical power from a power grid is unavailable. Solar cell arrays are also now being developed for grid-based electrical systems.

Solar cells operate by generating electron-hole pairs within a substrate (e.g., semiconductor substrate) in response to the absorption of incident photos into the substrate. When a photon is absorbed, its energy is given to an electron in the crystal lattice of the substrate. Usually, this electron is in the valence band of the crystal lattice and is tightly bound in covalent bonds between neighboring atoms. The energy given to the electron by the photon may be sufficient to excite the electron into the conduction band of the crystal lattice, where it then becomes free to move within the substrate. The covalent bond that the electron was previously part of now has one fewer electron, which is known as a "hole". The presence of a missing covalent bond allows bonded electrons from neighboring atoms to move into the "hole", leaving another hole behind, and in this way a hole can move throughout the lattice. This movement of electrons and holes within the substrate can then be utilized to establish a dc voltage across a load connected to the solar cells.

In particular, a built-in electric field generated within a p-n junction can be sufficient to cause movement of electrons and holes within electron-hole pairs to an n-type semiconductor region and p-type semiconductor region, respectively. One example of a solar cell that utilizes a p-n junction and a pair of electrodes on opposite surfaces of a semiconductor substrate is disclosed at U.S. Pat. Nos. 4,726,850 and 4,748,130. Another example of a solar cell is disclosed in U.S. Pat. No. 7,335,555 to Gee et al., entitled "Buried-Contact Solar Cell With Self-Doping Contacts".

SUMMARY OF THE INVENTION

Solar cells according to embodiments of the present invention include a substrate having a light collecting surface thereon and a P-N rectifying junction within the substrate. The P-N rectifying junction includes a base region of first conductivity type (e.g., p-type) and a semiconductor layer of second conductivity type extending between the base region and the light collecting surface. A trench is also provided, which extends through the semiconductor layer and into the base region. First and second electrodes are provided adjacent the light collecting surface. The first electrode is electrically coupled to the semiconductor layer and the second electrode is electrically coupled to the base region, at a location adjacent a bottom of the trench.

According to additional embodiments of the invention, a solar cell may further include electrically insulating trench sidewall spacers on sidewalls of the trench, which extend between the second electrode and the semiconductor layer of second conductivity type and provide electrical isolation therebetween. In addition, the semiconductor layer of second conductivity type may be an amorphous silicon layer having a different band gap relative to single crystal silicon. In particular, the semiconductor layer of second conductivity type may be an amorphous silicon layer that forms a heterojunction within the substrate. Solar cells according to these embodiments of the invention may also include a boundary layer of second conductivity type, which extends between the semiconductor layer of second conductivity type and the base region. The boundary layer of second conductivity type may form a non-rectifying heterojunction with the semiconductor layer of second conductivity type and a P-N rectifying junction with the base region.

Still further embodiments of the invention include an anti-reflective layer on the light collecting surface. This light collecting surface may be configured to have a non-uniform surface profile with localized peaks and valleys therein. In particular, the non-rectifying heterojunction may have a non-planar junction profile and the light collecting surface may have a non-uniform surface profile that approximates the non-planar junction profile of the non-rectifying heterojunction. Moreover, the non-rectifying heterojunction may have a first non-planar junction profile and the rectifying junction between the boundary layer and the base region may have a second non-planar junction profile that approximates a shape of the first non-planar junction profile.

Additional embodiments of the present invention include methods of forming solar cells. Some of these methods include forming a semiconductor layer of second conductivity type (e.g., n-type) on a semiconductor substrate having a base region of first conductivity (e.g., p-type) therein. A first trench is also formed, which extends through the semiconductor layer of second conductivity type and into the base region. This step of forming the first trench may be preceded by a step of forming an anti-reflective layer on the semiconductor layer of second conductivity type. Trench sidewall spacers are formed on sidewalls of the first trench. A second trench is also formed, which extends through a bottom of the first trench and further into the base region. The first and second trenches may be stripe-shaped trenches that extend across the substrate. The second trench is filled with a first electrode, which is electrically coupled to the base region. This step of filling the second trench may be preceded by a step of implanting dopants of first conductivity type into a bottom and sidewalls of the second trench. A second electrode may also be formed in contact with the semiconductor layer of second conductivity type. This second electrode may be formed outside and/or inside the first trench.

According to some of these method embodiments, the step of forming a first trench may be preceded by a step to form a boundary layer of second conductivity type in the base region.

This boundary layer may be formed by diffusing a sufficient quantity of second conductivity type dopants from the semiconductor layer into the base region to thereby convert a portion of the base region from first conductivity type to net second conductivity type. This boundary layer may form a non-rectifying heterojunction with the semiconductor layer, which may include amorphous silicon. The semiconductor layer may be formed by depositing an in-situ doped amorphous silicon layer on a surface of the substrate. This surface may have a non-uniform surface profile with localized peaks and valleys therein.

Methods of forming solar cells according to additional embodiments of the invention include texturizing a surface of a silicon wafer having a base region of first conductivity type therein to generate localized peaks and valleys in the surface. After the surface has been texturized, an in-situ doped amorphous silicon layer of second conductivity type may be deposited onto the textured surface to thereby define a textured rectifying heterojunction with the surface. This amorphous silicon layer may have a doping concentration therein in a range from about $1 \times 10^{19}$ cm$^{-3}$ to about $1 \times 10^{21}$ cm$^{-3}$. A boundary layer of second conductivity type is then formed in the base region, by diffusing a sufficient quantity of second conductivity type dopants from the amorphous silicon layer into the base region to thereby convert a portion of the base region from net first conductivity type to net second conductivity type. A trench is then formed that extends through the amorphous silicon layer and the boundary layer and into the base region. First and second electrodes are also formed. The first electrode is electrically coupled to the amorphous silicon layer and the second electrode electrically is coupled to the base region adjacent a bottom of the trench. In some of these embodiments of the invention, the steps of forming the first and second electrodes includes depositing a second electrode at the bottom of the trench and depositing a first electrode adjacent a top of the trench after covering the second electrode with an electrically insulating separating layer.

According to some of these embodiments of the invention, the step of texturizing includes etching the surface of the silicon wafer by exposing the surface to an etchant that causes the formation of residues on the surface, which act as localized etching masks to further etching. In particular, the step of texturizing the surface may include exposing the surface to a dry etchant containing chlorine and fluorine. In particular, the dry etchant may be formed by combining chlorine (Cl2), oxygen (O2) and SF6 source gases in a low pressure processing chamber.

According to additional embodiments of the invention, the step of forming the boundary layer includes forming a boundary layer having a preferred thickness in a range from about 500 Å to about 2000 Å, by annealing the amorphous silicon layer of second conductivity type at a temperature in a range between about 500° C. and about 900° C. Moreover, the step of forming the trench may include forming a grid-shaped trench by forming a plurality of crisscrossing grooves in a surface of the silicon wafer. This grid-shaped trench may also include an outermost ring-shaped trench adjacent a perimeter of the silicon wafer. The step of forming the first electrode may also be followed by selectively removing a portion of the first electrode and an underlying portion of the electrically insulating separating layer in the ring-shaped trench to thereby expose the second electrode.

BRIEF DESCRIPTION OF THE DRAWINGS

FIGS. 14A-20A are plan views of intermediate structures that illustrate methods of forming an integrated circuit solar cell according to an embodiment of the present invention.

FIGS. 14B-20B are cross-views of the intermediate structures of FIGS. 14A-20A, taken along line I-I'.

FIGS. 21A-23A are plan views of intermediate structures that illustrate respective methods of forming integrated circuit solar cells according to the embodiments of the present invention illustrated by FIGS. 12A and 12C.

FIGS. 21B-23B are cross-sectional views of the intermediate structures of FIGS. 21A-23A, taken along line I-I'.

FIGS. 24A-25A and 13A are plan views of intermediate structures that illustrate respective methods of forming integrated circuit solar cells according to embodiments of the present invention.

FIGS. 24B-25B are cross-sectional views of the intermediate structures of FIGS. 24A-25A, taken along line I-I'.

DETAILED DESCRIPTION OF PREFERRED EMBODIMENTS

Figure 1:
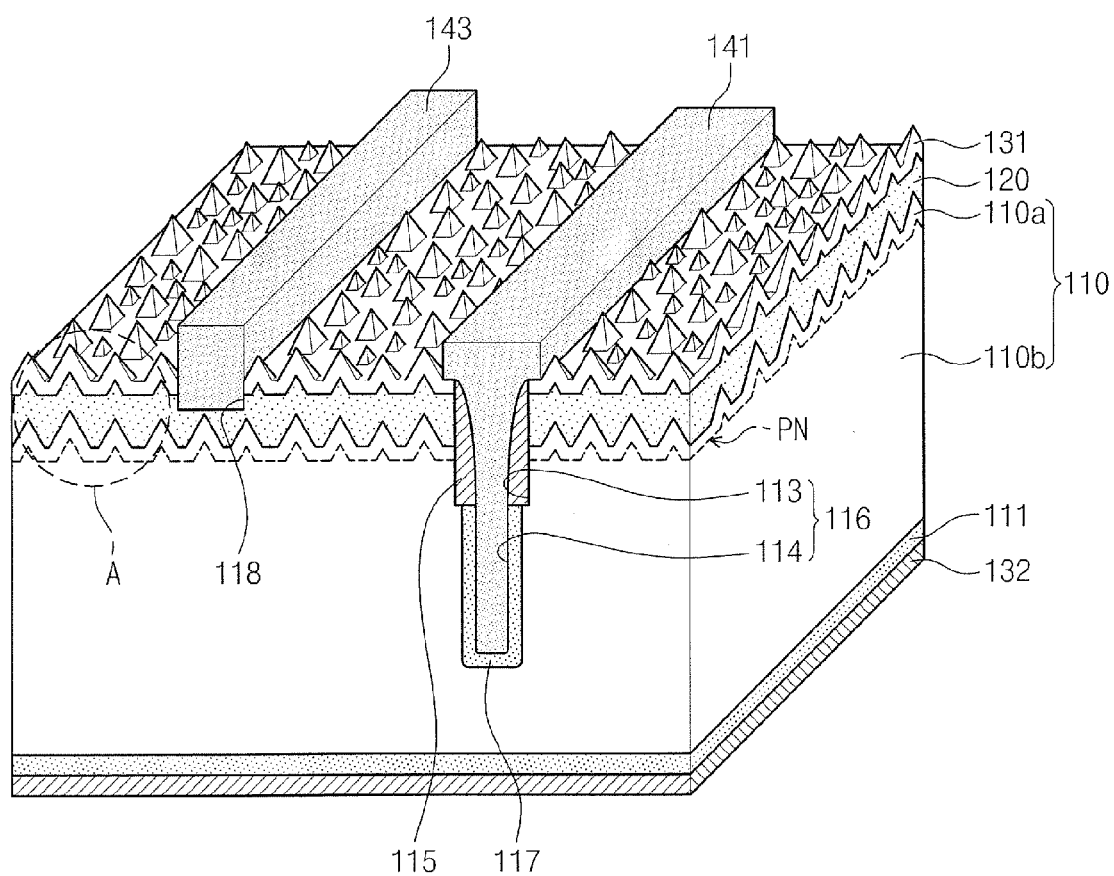
FIG. 1 is a cross-sectional view of an integrated circuit solar cell according to an embodiment of the present invention.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

In the specification, it will be understood that when a layer a layer (or film) is referred to as being "on" another layer or substrate, it may be directly on the other layer or substrate, or intervening layers may also be present. Also, in the figures, the dimensions of layers and regions may be exaggerated for clarity of illustration. In addition, terms like a "first", "second" and "third" are used to describe various regions and layers in various embodiments of the present invention, the regions and layers are not limited to these terms. These terms are used only to discriminate one region or layer from another region or layer. Therefore, a layer referred to as a "first layer" in one embodiment can be referred to as a "second layer" in another embodiment.

Figure 2:
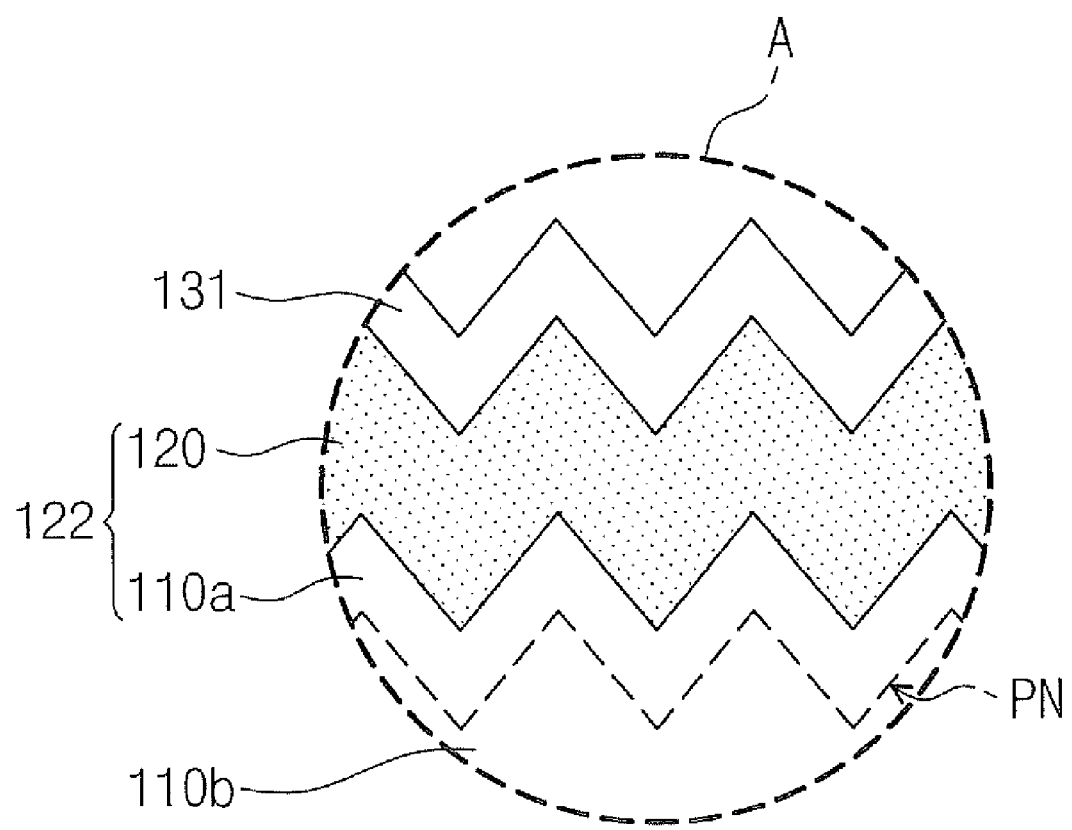
FIG. 2 is an enlarged cross-sectional view of a highlighted portion of the solar cell of FIG. 1.

Referring now to FIGS. 1-2, solar cells according to embodiments of the present invention may include a substrate having an upper surface, which represents a light collecting surface, and a bottom surface extending opposite the upper surface. The substrate is illustrated as including a semiconductor substrate region 110, which may be doped with first conductivity type dopants (e.g., p-type dopants). In particular, the substrate region 110 may originate as a p-type single crystal silicon wafer that may undergo the semiconductor processing steps illustrated by FIGS. 3-9, which are described hereinbelow. The substrate may also include a semiconductor layer of second conductivity type 120 (e.g., n-type) extending on the substrate region 110. An upper surface of the semiconductor layer of second conductivity type 120 may operate as the light collecting surface and an anti-reflective layer 131 may be formed on the light collecting surface. The purpose of the anti-reflective layer 131 may be to provide, among other things, increased light collection efficiency by reducing reflection of incident light away from the light collecting surface.

As illustrated in detail by FIG. 2, which highlights region "A" illustrated by FIG. 1, the substrate region 110 includes a base region 110b of net first conductivity type (e.g., p-type) and a boundary layer 110a of net second conductivity type, which forms a P-N rectifying junction with the base region 110b. As described more fully hereinbelow, this boundary layer 110a may be formed by diffusing a sufficient quantity of dopants (e.g., n-type dopants) from the semiconductor layer of second conductivity type 120 into the base region 110b, to thereby convert a portion of the base region 110b from first conductivity type to net second conductivity type.

The boundary layer 110a and the semiconductor layer of second conductivity type 120 may collectively form an electrically conductive region of second conductivity type 122. In addition, the semiconductor layer of second conductivity type 120 may be formed as an amorphous silicon layer, which forms a non-rectifying heterojunction with the boundary layer 110a. This heterojunction may advantageously support higher light collection efficiency relative to a homogenous junction by increasing a range of wavelengths that can be captured to thereby generate electron-hole pairs adjacent the P-N junction. The semiconductor layer 120 may be a relatively highly doped layer, which can be formed as an in-situ doped semiconductor layer having a second conductivity type (e.g., phosphorus) doping concentration therein in a range from about $10^{19}$ cm$^{-3}$ to about $10^{21}$ cm$^{-3}$, for example. The thickness of the boundary layer 110a is chosen to increase solar cell efficiency by reducing undesirable electron-hole recombination adjacent the P-N junction. Although not wishing to be bound by any theory, an insufficiently thick boundary layer 110a may be associated with a relatively high degree of electron-hole recombination caused by interface defects at the heterojunction between the boundary layer 110a and the semiconductor layer of second conductivity type 120. Alternatively, an excessively thick boundary layer 110a may be limited by relatively high electron-hole recombination caused by excessive carrier drift (i.e., migration) across a wide depletion region surrounding the P-N junction. Based on these considerations, a boundary layer 110a having a thickness in a range from about 500 Å to about 2000 Å may support a high degree of light collection efficiency by reducing electron-hole recombination therein for the given semiconductor material.

The anti-reflective layer 131, which may be deposited on the semiconductor layer of second conductivity type 120, may have a thickness of about λ/4 in order to increase light absorption efficiency, where λ is a wavelength of the desired light to be incident on the light collecting surface during operation of the solar cell. Moreover, the anti-reflective layer 131 may be formed as a multi-layer structure, such as a layer including a silicon oxide layer and a silicon nitride layer. In addition to increasing the light collecting efficiency of the solar cell, the anti-reflective layer 131 may also operate to protect and provide electrical passivation to the underlying light collecting surface of the solar cell.

Referring still to FIG. 2, the light collecting surface, which is illustrated as an interface between the semiconductor layer of second conductivity type 120 and the anti-reflective layer 131, may be configured to have a non-uniform surface profile with localized peaks and valleys therein. This non-uniform surface profile may be reflected in the plurality of spaced-apart pyramid-shaped protrusions illustrated in the surface of the anti-reflective layer 131. In particular, the non-rectifying heterojunction between the semiconductor layer of second conductivity type 120 and the boundary layer 110a may have a non-planar junction profile and the light collecting surface may have a non-uniform surface profile that approximates the non-planar junction profile of the non-rectifying heterojunction. Moreover, the non-rectifying heterojunction may have a first non-planar junction profile and the rectifying junction between the boundary layer 110a and the base region 110b may have a second non-planar junction profile that approximates a shape of the first non-planar junction profile.

The solar cell of FIG. 1 further includes a pair of electrodes disposed on the light collecting surface. This pair of electrodes is illustrated as a first electrode 141, which is electrically coupled to the base region 110b, and a second electrode 143, which is electrically coupled to the semiconductor layer of second conductivity type 120. These electrodes may be stripe-shaped electrodes having relatively narrow widths, which reduce shading loss at the light collecting surface. The first and second electrodes 141 and 143 may be formed of at least one metal selected from a group consisting of aluminum (Al), copper (Cu), nickel (Ni), tungsten (W), titanium (Ti), titanium nitride (TiN), tungsten nitride (WN). The electrodes 141 and 143 may also include metal silicide layers and/or multilayer conductors such as Ti/TiN/Al or Ti/TiN/W.

A trench 116 is also provided, which extends through the semiconductor layer of second conductivity type 120 and into the base region 110b. As explained more fully hereinbelow, the trench 116 may be formed from an upper stripe-shaped trench 113 and a lower stripe-shaped trench 114, which extends through a bottom of the upper trench 113. The lower trench 114 may have a width in a range from about 0.3 microns to about 1 micron, for example, and have a stripe or similar shape that extends across the substrate. The sidewalls of the upper trench 113 may be lined with electrically insulating sidewall spacers 115, which may be formed as oxide and/or nitride insulating layers, for example. These sidewall spacers 115 operate to electrically isolate the first electrode 141 from the semiconductor layer of second conductivity type 120. Moreover, a relatively highly doped impurity region 117 of first conductivity type may be formed in the sidewalls and bottom of the lower trench 114 to reduce the series resistance between the base region 110b and the first electrode 141 within the lower trench 114. This impurity region 117 may have a thickness of about 0.3 microns, for example. A relatively shallow trench/recess 118 may also be formed within the semiconductor layer 120 and filled with the second electrode 143, as illustrated.

Figure 3:
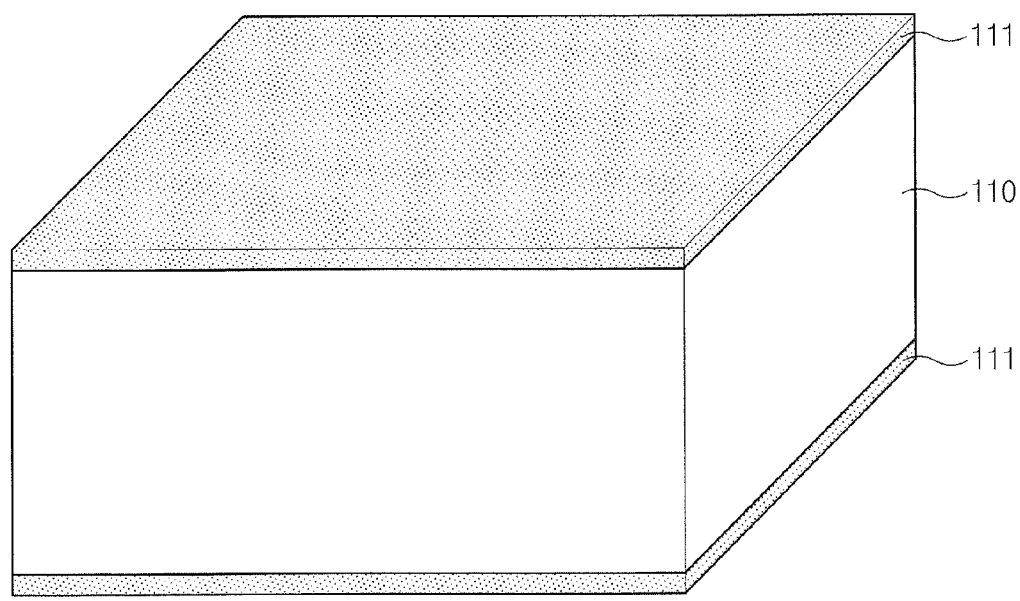
FIGS. 3-9 are cross-sectional views of intermediate structures that, in combination with FIG. 1, illustrate methods of forming integrated circuit solar cells according to embodiments of the present invention.
Figure 4:
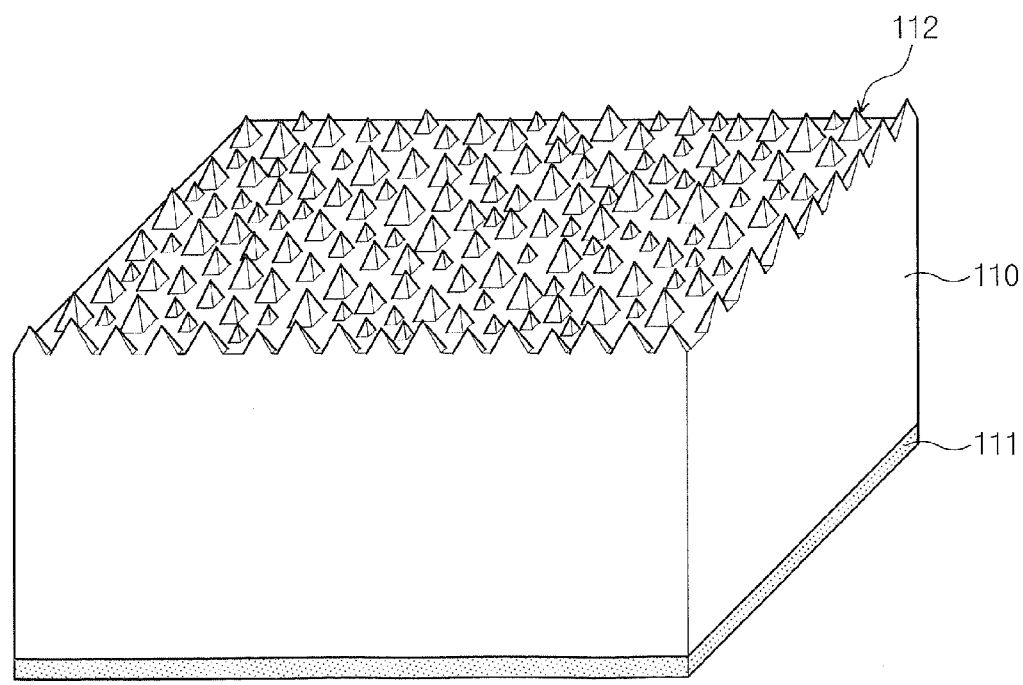

FIGS. 3-9 illustrate additional embodiments of the invention, which include methods of forming the solar cells of FIGS. 1-2. As illustrated by FIG. 3, these methods may include the optional step of forming a back surface field (BSF) region 111 of first conductivity type (e.g., P-type) in a semiconductor substrate 110 of first conductivity type (e.g., P-type wafer), by implanting first conductivity type dopants (e.g., boron (B)) into opposing front and back surfaces of the substrate 110 and then thermally treating the substrate 110 to thereby drive-in the implanted dopants. Thereafter, as illustrated by FIG. 4, the front surface of the substrate 110 may be made uneven by generating a plurality of peaks and valleys therein. These peaks in the front surface are illustrated as having a pyramid or similar structure 112, and may be formed using conventional techniques, such as plasma etching, mechanical scribing, photolithography and chemical etching. For example, an oxide layer (not shown) may be formed as sacrificial layer on the front surface of the substrate 110 and then photolithographically patterned using a patterned photoresist layer (not shown) as an etching mask. The front surface of the substrate 110 may then be etched using the patterned sacrificial layer as an etching mask. During this process, any BSF region 111 on the front surface of the substrate 110 is typically removed.

Figure 5:
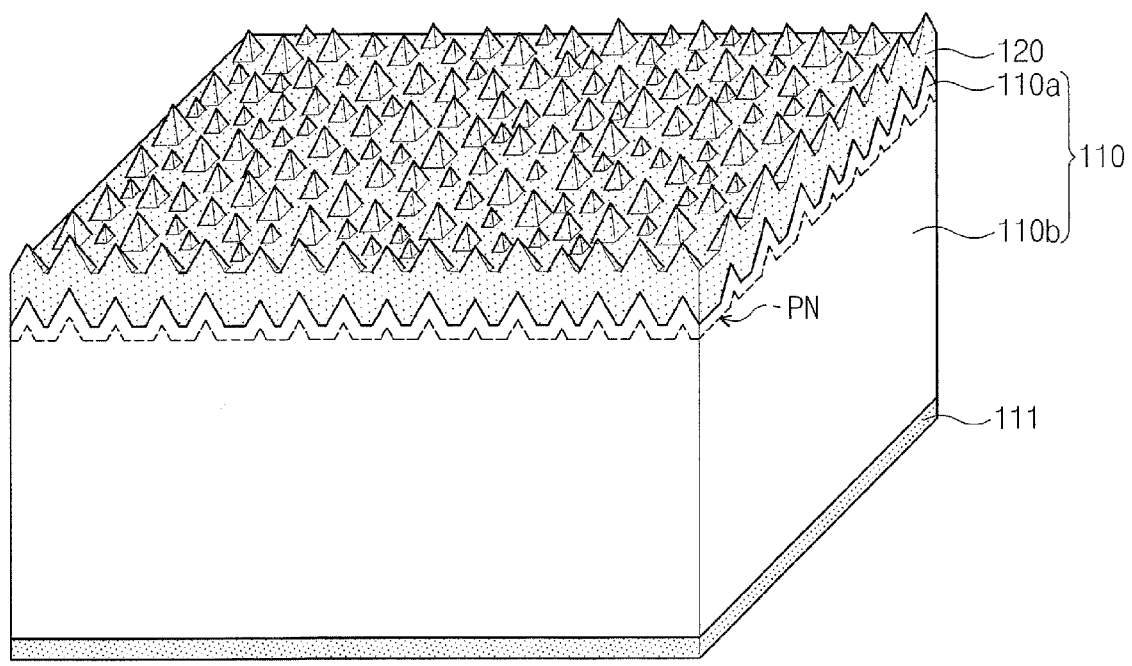

Referring now to FIG. 5, an amorphous semiconductor layer 120 is formed on the uneven front surface of the substrate 110. This amorphous semiconductor layer 120 may be a highly doped (e.g., in-situ doped) layer of net second conductivity type (e.g., N-type). In particular, the second conductivity type doping concentration in the amorphous semiconductor layer 120 may be in a range from about $1 \times 10^{19}/cm^3$ to about $1 \times 10^{21}/cm^3$. The amorphous semiconductor layer 120, which may have a thickness in a range from about several hundred angstroms to about 1,000 Å, and typically about 600 Å, may be deposited using various techniques. These techniques include plasma enhanced chemical vapor deposition (PECVD) or low-pressure CVD using silane and hydrogen gas. In particular, an in-situ doped amorphous semiconductor layer 120 may be formed by chemical vapor deposition using silane ($SiH_4$), phosphine ($PH_4$) and hydrogen gas.

Referring still to FIG. 5, a boundary layer 110a of second conductivity type is formed by diffusing second conductivity type dopants from the amorphous semiconductor layer 120 into the substrate 110, to thereby define a boundary layer 110a that forms a P-N rectifying junction with a base region 110b of first conductivity type. This diffusion of second conductivity type dopants may be performed by annealing the substrate 110. To increase solar cell efficiency by reducing undesirable electron-hole recombination adjacent the P-N rectifying junction, the annealing may be performed at a sufficient temperature and for a sufficient duration to yield a boundary layer 110a having a thickness in a range from about 500 Å to about 2000 Å. According to some embodiments of the invention, the unevenness of the surface of the amorphous semiconductor layer 120 may again be increased by growing an HSG (hemispherical silicon grain) layer on the amorphous semiconductor layer 120, to thereby increase the light collection efficiency of the solar cell. Alternatively, an electrically conductive and optically transparent layer (e.g., a ZnO layer) having a coarse surface structure may be deposited on the amorphous semiconductor layer 120.

Figure 6:
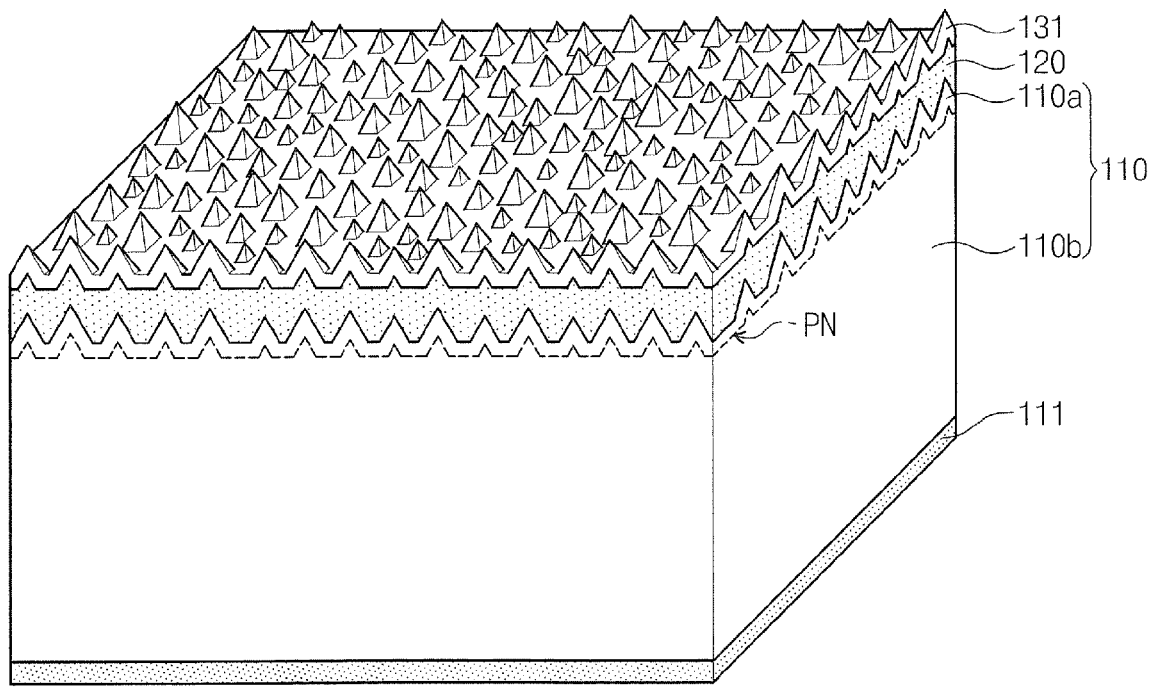
Figure 7:
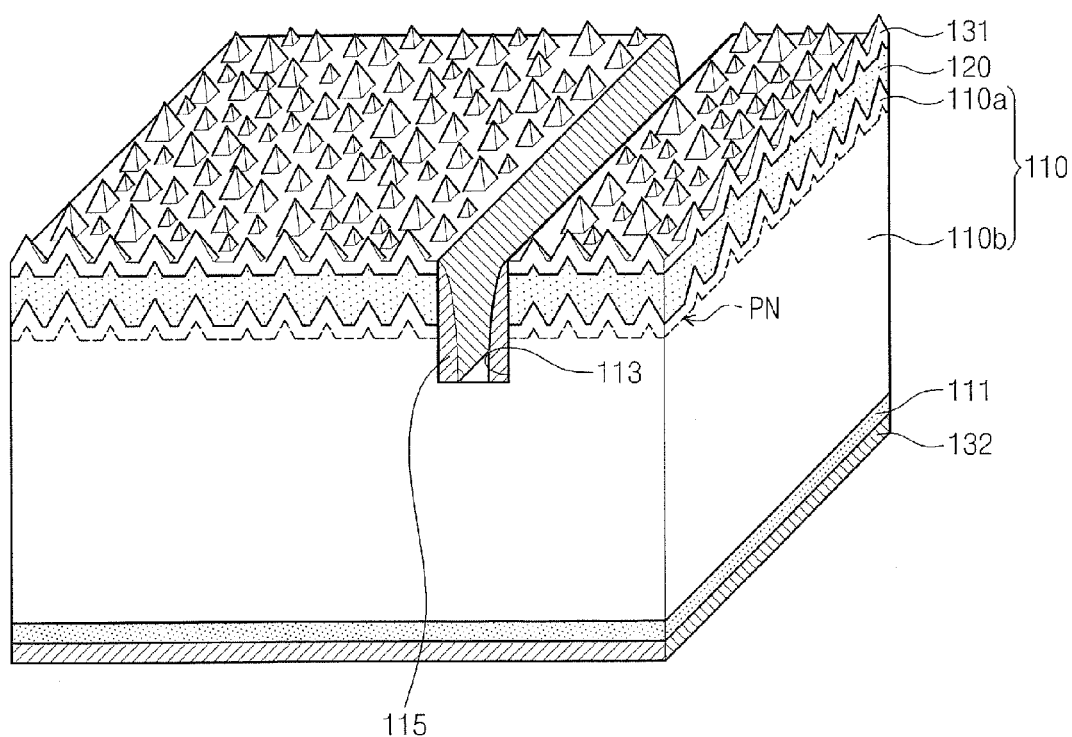

As illustrated by FIG. 6-7, an anti-reflective layer 131 is then formed on the amorphous semiconductor layer 120. This anti-reflective layer 131 may be formed by depositing one or more electrically insulating layers (e.g., silicon dioxide, silicon nitride) on an upper surface of the amorphous semiconductor layer 120 using conventional deposition techniques, such as plasma enhanced chemical vapor deposition (PECVD). In order to increase light absorption efficiency, the anti-reflective layer 131 may have a thickness of about $\lambda/4$, where $\lambda$ is a wavelength of the desired light to be incident on the light collecting surface during operation of the solar cell. A photolithographically defined etching step (e.g., dry etching) may then be performed to define a relatively narrow stripe-shaped first trench 113 that extends through the amorphous semiconductor layer 120 and the boundary layer 110a and into the base region 110b. According to some of these embodiments of the invention, the stripe-shaped first trench 113 may have a width of about 1 μm or less. For example, the stripe-shaped trench may have a width of about 0.3 μm.

Sidewall insulating spacers 115 are formed on the sidewalls of the first trench 113. These sidewall insulating spacers 115 may be formed as a silicon dioxide layer or silicon nitride layer or as a composite of multiple insulating layers. The sidewall insulating spacers 115 may be formed by conformally depositing an electrically insulating layer into the first trench 113 and then anisotropically etching back the deposited layer until a bottom of the first trench 113 is exposed. This step of conformally depositing an electrically insulating layer may include depositing a protective insulating layer 132 on a bottom surface of the substrate 110.

Figure 8:
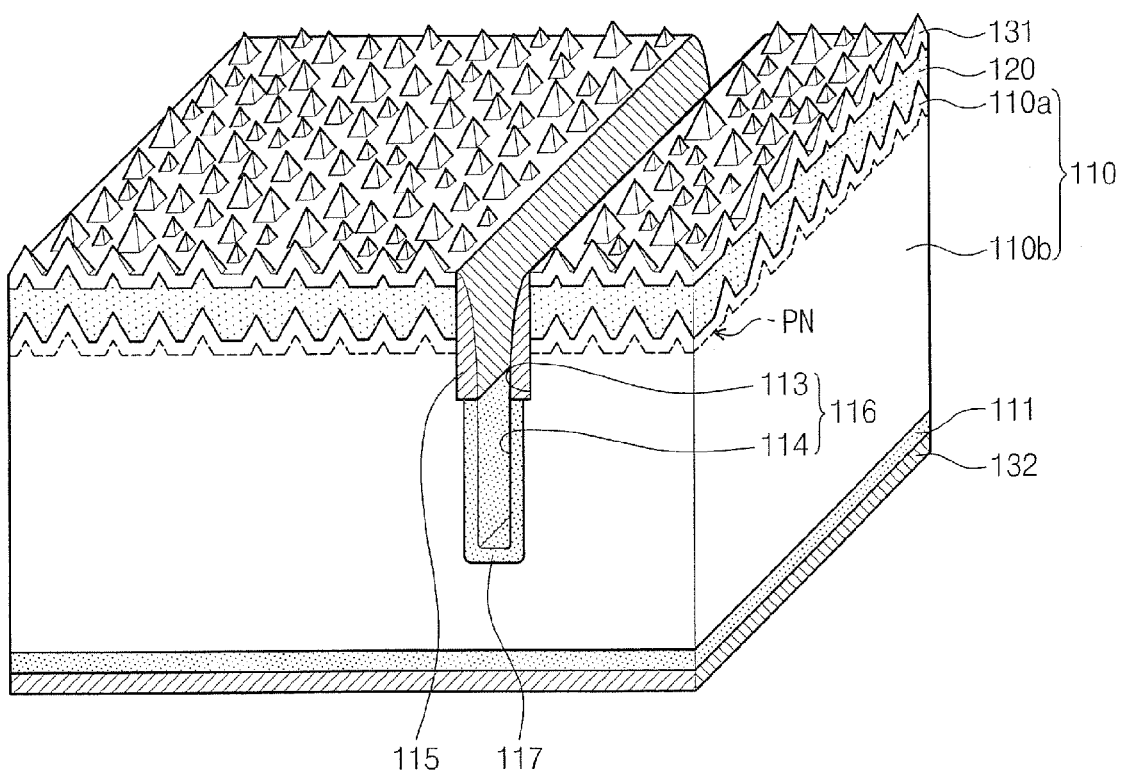
Figure 9:
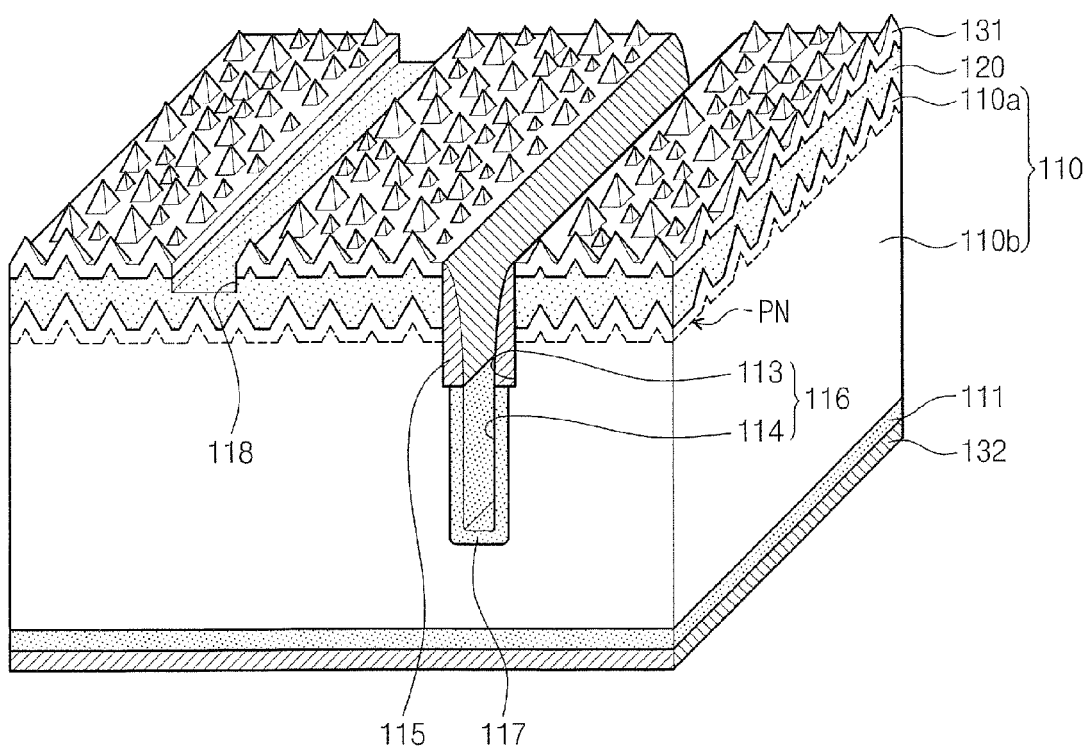

Referring now to FIG. 8, a bottom of the first trench 113 is further etched using a first mask (not shown) and the sidewall insulating spacers 115 as an etching mask. This etching step results in the formation of an extension trench 114 that may extend substantially into the base region 110b. The first trench and extension trench 114 collectively form a multi-level trench 116 having upper sidewalls covered by the sidewall insulating spacers 115. The step of forming the extension trench 114 may be followed by a step to form a relatively highly doped impurity region 117 by selectively implanting first conductivity type dopants (e.g., P-type dopants) into a bottom and sidewalls of the extension trench 114. Thereafter, as illustrated by FIG. 9, a selective etching step is then performed to etch a relatively shallow second trench 118 that extends through the anti-reflective layer 131 and into the amorphous silicon layer 120. This second trench 118 is formed to be shallower than the P-N rectifying junction. The multi-level trench 116 and the second trench 118 are then filled with first and second electrodes 141 and 143, respectively, as illustrated by FIG. 1. These first and second electrodes 141 and 143 may be formed by depositing and then patterning a metal layer. The metal layer may be formed of at least one metal selected from a group consisting of aluminum (Al), copper (Cu), nickel (Ni), tungsten (W), titanium (Ti), titanium nitride (TiN), tungsten nitride (WN) and silicides of these metals. In particular, according to some embodiments of the present invention, the metal layer may be a Ti/TiN/Al or Ti/TiN/W layer. The formation of these first and second electrodes 141 and 143 may be followed by a step to anneal the electrodes in an ambient containing hydrogen. This hydrogen anneal may operate to active N-type dopants within the substrate and thereby improve electron mobility and also cure defects in a surface of the substrate and thereby reduce leakage currents during operation.

Figure 10A:
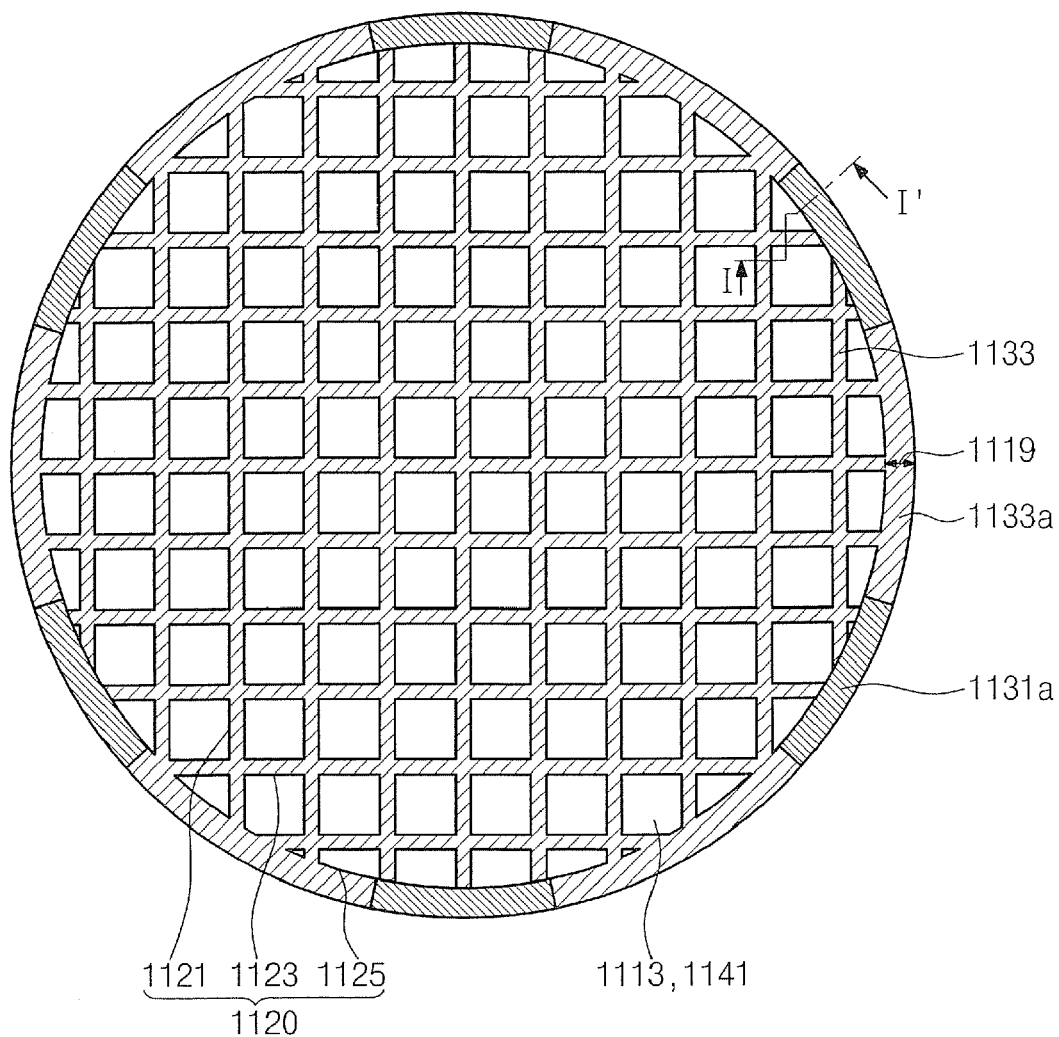
FIG. 10A is a plan view of an integrated circuit solar cell according to an embodiment of the present invention.
Figure 10B:
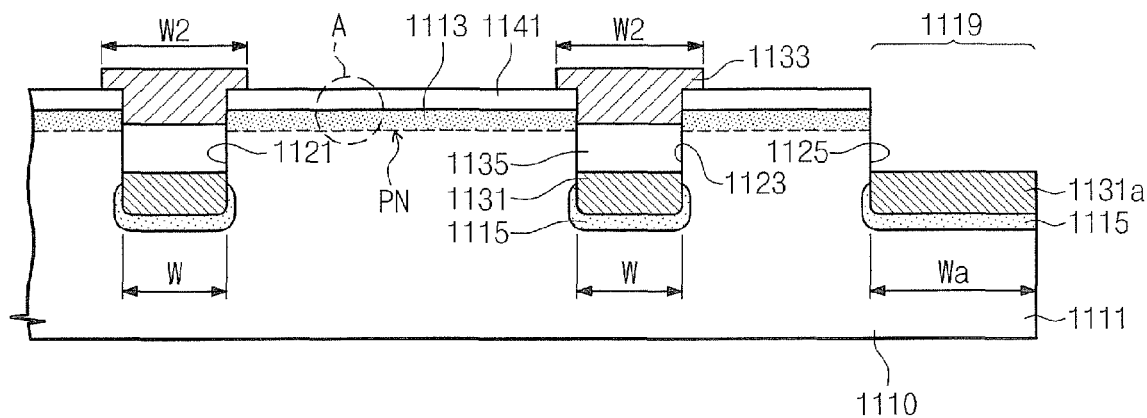
FIG. 10B is a cross-sectional view of the integrated circuit solar cell of FIG. 10A, taken along line I-I'.
Figure 11:
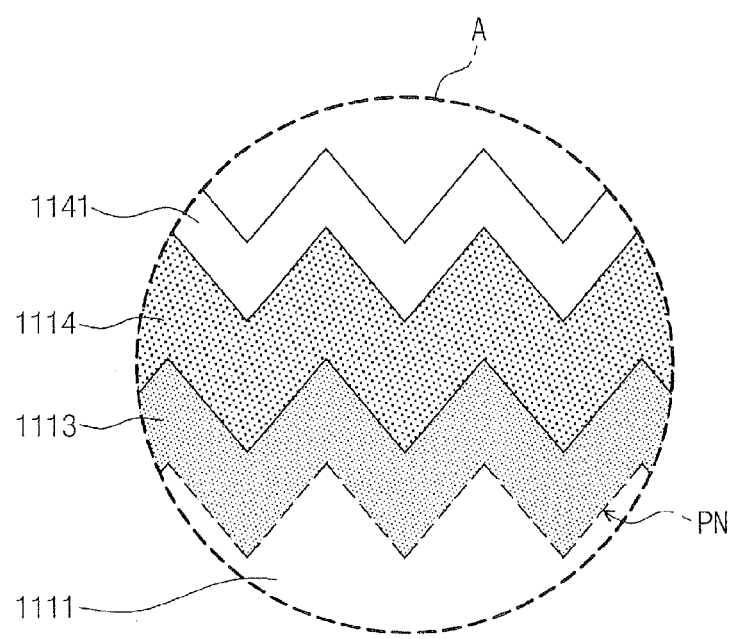
FIG. 11 is an enlarged cross-sectional view of a highlighted portion of the solar cell of FIG. 10B.

Referring now to FIGS. 10A-10B and 11, solar cells according to additional embodiments of the invention are illustrated as being formed in a semiconductor substrate 1110 (e.g., single crystal semiconductor (e.g., silicon) wafer) having a base region 1111 of first conductivity type (e.g., P-type) therein. As highlighted by region "A" in FIGS. 10B and 11, this substrate 1110 may include a textured surface, which is configured to enhance the light collection efficiency of the solar cell by reducing the reflection of incident light away from an upper light collecting surface of the substrate 1110. A P-N rectifying junction having an uneven profile is provided between a boundary layer 1113 of second conductivity type (e.g., N-type) and the base region 1111. This boundary layer 1113, which may have a net N-type doping concentration in a range from about $1 \times 10^{19}$ cm$^{-3}$ to about $1 \times 10^{21}$ cm$^{-3}$ therein, may be formed within the base region 1111 by diffusing second conductivity type dopants (e.g., phosphorus (P)) from a relatively highly doped semiconductor layer 1114 (e.g., N+ amorphous silicon layer). The thickness of the boundary layer 1113 can be chosen to increase solar cell efficiency by reducing undesirable electron-hole recombination adjacent the P-N junction.

Although not wishing to be bound by any theory, an insufficiently thick boundary layer 1113 may be associated with a relatively high degree of electron-hole recombination caused by interface defects at an heterojunction between the boundary layer 1113 and the semiconductor layer of second conductivity type 1114. Alternatively, an excessively thick boundary layer 1113 may be limited by relatively high electron-hole recombination caused by excessive carrier drift (i.e., migration) across a wide depletion region surrounding the P-N junction. Based on these considerations, a boundary layer 1113 having a thickness in a range from about 500 Å to about 2000 Å may support a high degree of light collection efficiency by reducing electron-hole recombination therein.

Moreover, the heterojunction between the boundary layer 1113 and the semiconductor layer of second conductivity type 1114 may advantageously support higher light collection efficiency relative to a homogenous junction, by increasing a range of wavelengths that can be captured to thereby generate electron-hole pairs adjacent the P-N junction. FIGS. 10A-10B and 11 further illustrate the inclusion of an anti-reflective layer 1141 on the semiconductor layer of second conductivity type 1114. As explained hereinabove, this anti-reflective layer 1141 may have a thickness that is proportional to a wavelength of the incident light. For example, the anti-reflective layer 1141 may have a thickness of about λ/4 in order to increase light absorption efficiency, where λ is a wavelength of the desired light to be incident on a light collecting surface of the solar cell. This anti-reflective layer 1141, which may be formed as a silicon oxide layer, a silicon nitride layer or a multilayer thereof, may also provide electrical and physical passivation and protection to the solar cell.

A trench 1120, which includes a two-dimensional array of criss-crossing trenches 1121 and 1123 and an outer ring-shaped "edge" trench 1125, is formed in the substrate 1110. As illustrated by FIG. 10B, which represents a cross-sectional view of the solar cell of FIG. 10A taken along line I-I', the trench 1120 extends completely through the anti-reflective layer 1141, the semiconductor layer of second conductivity type 1114 and the boundary layer 1113. The trenches 1121 and 1123 may have widths "W" of about 1 μm or less (e.g., 0.3 μm) to reduce shading loss from the incident light, but the "edge" trench 1125 may be sufficiently wider (see, e.g., "Wa">"W") to support low resistance contacts and wire bonding. The trenches 1121 and 1123 should be appreciably deeper than the P-N rectifying junction between the boundary layer 1113 and the base region 1111, so that sufficiently low resistance contacts can be made between trench electrodes 1131, 1131a and the base region 1111.

As illustrated best by FIG. 10B, impurity regions 1115 of first conductivity type may be provided at the bottoms and lower sidewalls of the trench 1120, using a combination of selective implantation and dopant drive-in techniques. The impurity regions 1115 typically have a net first conductivity type doping concentration therein that exceeds a first conductivity type doping concentration in the base region 1111. As will be understood by those skilled in the art, the impurity regions 1115 may operate as a back surface field (BSF) region that enhances current collection from the base region 1111.

FIGS. 10A-10B also illustrate the inclusion of first and second electrodes on a front (i.e., light collecting) surface of the solar cell. The first electrode 1131, 1131a is illustrated as extending adjacent a bottom of the trench 1120, in ohmic contact with the impurity regions 1115 and/or base region 1111. An electrically insulating layer 1135 (e.g., silicon dioxide) is provided on the first electrode 1131, 1131a, within the trench 1120, and the second electrode 1133, 1133a is provided on the electrically insulating layer 1135, as illustrated. This second electrode 1133, 1133a may be formed in ohmic contact with the semiconductor layer of second conductivity type 1114 and may extend onto an upper surface of the anti-reflective layer 1141. A width W2 of the second electrode 1133 may be greater than a width "W" of the trenches 1121, 1123. The electrically insulating layer 1135 may have an upper surface below an interface between the boundary layer 1113 and the semiconductor layer of second conductivity type 1114, as illustrated.

Electrical contact can be made (e.g., by wire bonding) to the first electrode 1131a, adjacent a periphery of semiconductor substrate 1110 at the edge opening 1119, and to the second electrode 1133a extending in arc-shaped segments around the periphery, as illustrated by FIG. 10A. In particular, arc-shaped openings can be formed within the second electrode 1133a and the underlying electrically insulating layer 1135, to thereby expose an upper surface of the first electrode 1131a adjacent a bottom of the ring-shaped "edge" trench 1125.

According to some embodiments of the invention, the first electrode 1131, 1131a and the second electrode 1133, 1133a may be formed of a material selected from a group consisting of aluminum (Al), copper (Cu), nickel (Ni), tungsten (W), titanium (Ti), titanium nitride (TiN), tungsten nitride (WN) and metal suicides and combinations of these electrically conductive materials. For example, in some embodiments of the invention, the first electrode 1131, 1131a and the second electrode 1133, 1133a may be formed as a composite of Ti/TiN/Al or Ti/TiN/W. Alternatively, the first electrode 1131, 1131a may be formed as a P-type semiconductor electrode and the second electrode 1133, 1133a may be formed as an N-type semiconductor electrode.

Figure 12A:
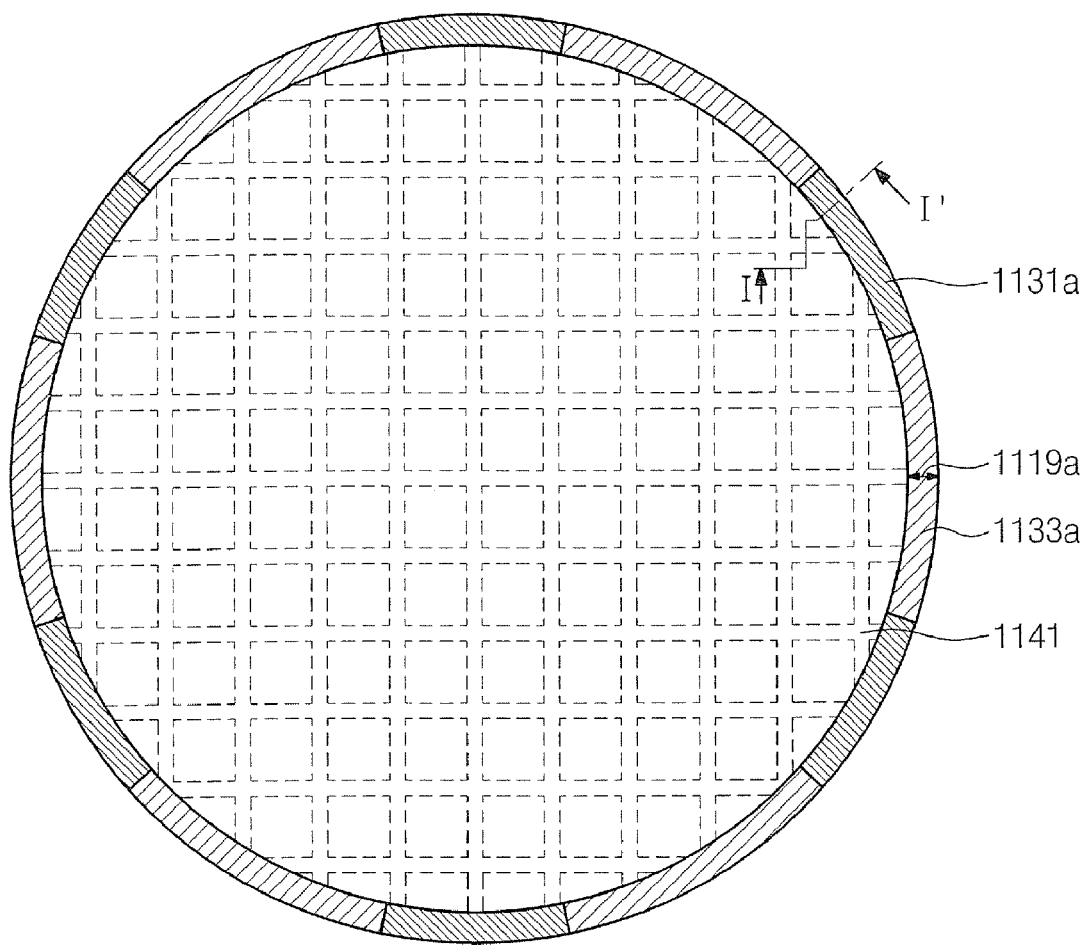
FIG. 12A is a plan view of an integrated circuit solar cell according to an embodiment of the present invention.
Figure 12B:
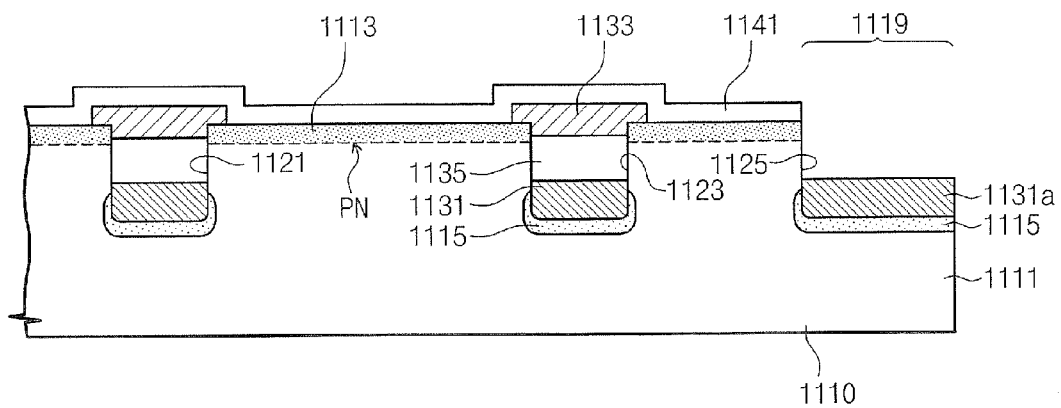
FIG. 12B is a cross-sectional view of the integrated circuit solar cell of FIG. 12A, taken along line I-I'.
Figure 12C:
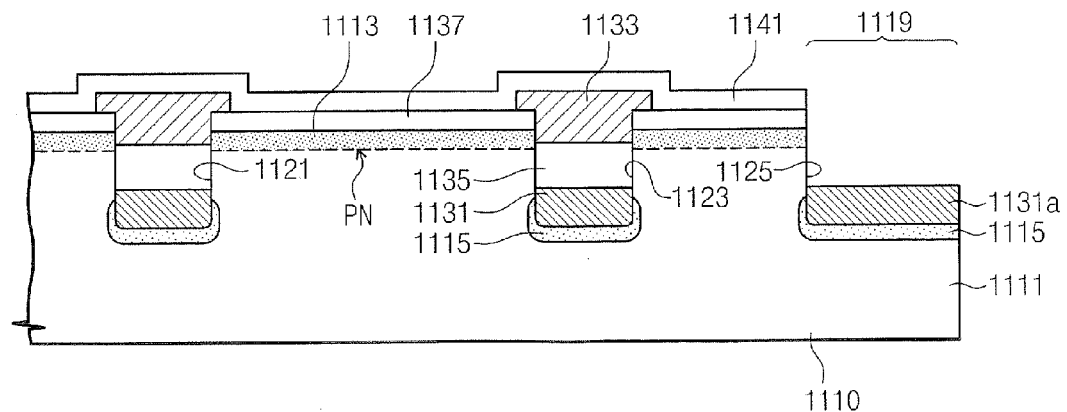
FIG. 12C is an alternative cross-sectional view of the integrated circuit solar cell of FIG. 12A, taken along line I-I'.

Solar cells according to still further embodiments of the invention are illustrated by FIGS. 12A-12C. In particular, the solar cell embodiment of FIGS. 12A-12B is similar to the solar cell embodiment of FIGS. 10A-10B, however, a location of the anti-reflective layer 1141 of FIGS. 10A-10B relative to the second electrode 1133 is modified. In particular, as illustrated by FIGS. 12A-12B, the anti-reflective layer 1141 may be formed as a blanket layer to cover portions of the second electrode 1133 (and boundary layer 1113) that are interior relative to the peripheral edge of the substrate 1110. Alternatively, FIG. 12C illustrates an embodiment of the invention that has an optically transparent electrically conductive layer 1137 provided between the anti-reflective layer 1141 and the boundary layer 1113. In this embodiment, the second electrode 1133 is patterned to extend directly on an upper surface of the optically transparent electrically conductive layer 1137. In this manner, the optically transparent electrically conductive layer 1137 can operate as a low resistance layer to facilitate uniform spreading of current therein, which is passing between the second electrode 1133 and the boundary layer 1113 (via the semiconductor layer of second conductivity type 1114, not shown). The optically transparent electrically conductive layer 1137 can be formed as an indium tin oxide (ITO) layer or a zinc oxide (ZnO) layer, however, other optically transparent materials can also be used. A surface texture of the optically transparent electrically conductive layer 1137 may also be relatively rough to thereby improve the light collection efficiency of the solar cell.

Figure 13A:
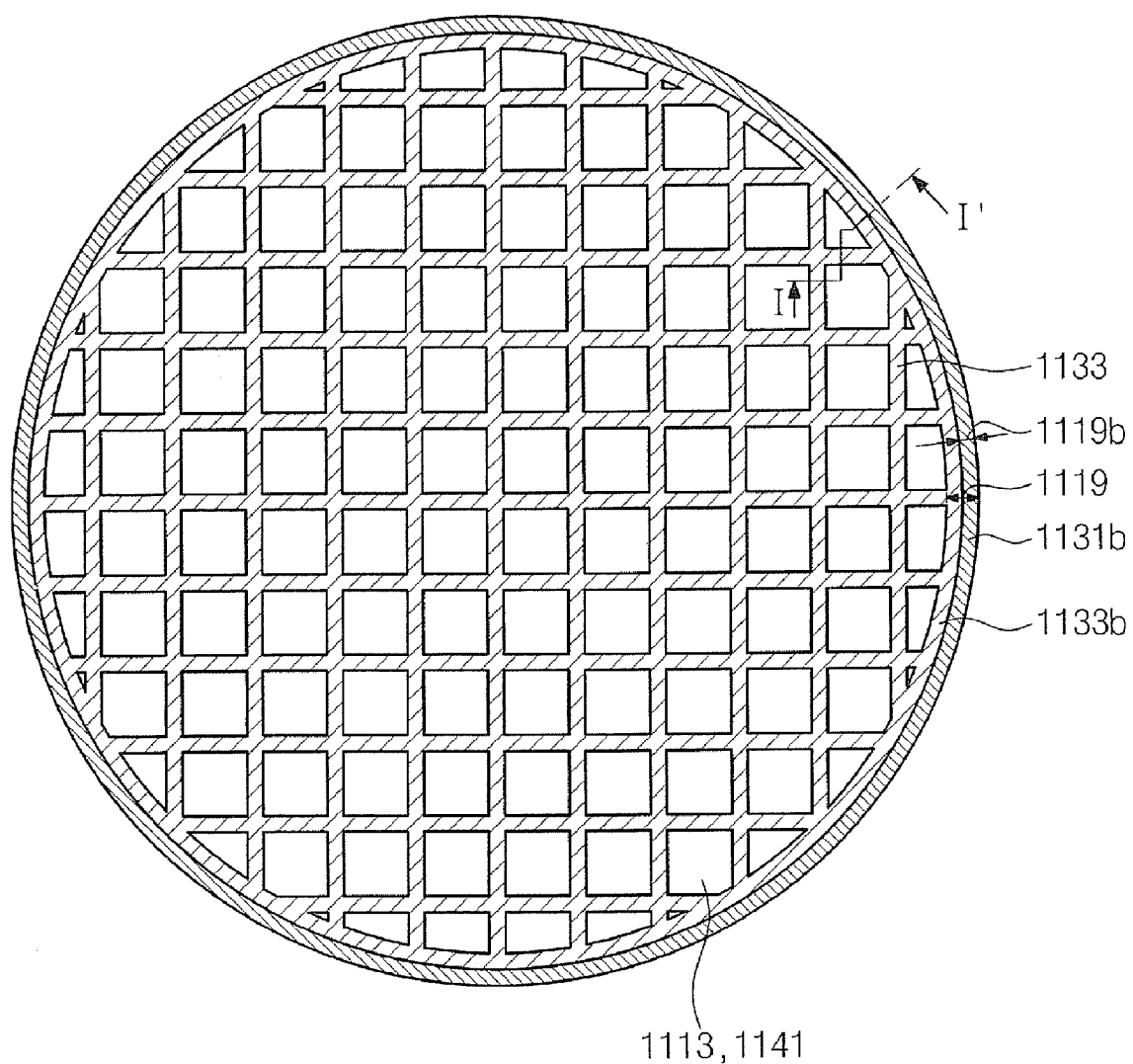
FIG. 13A is a plan view of an integrated circuit solar cell according to an embodiment of the present invention.
Figure 13B:
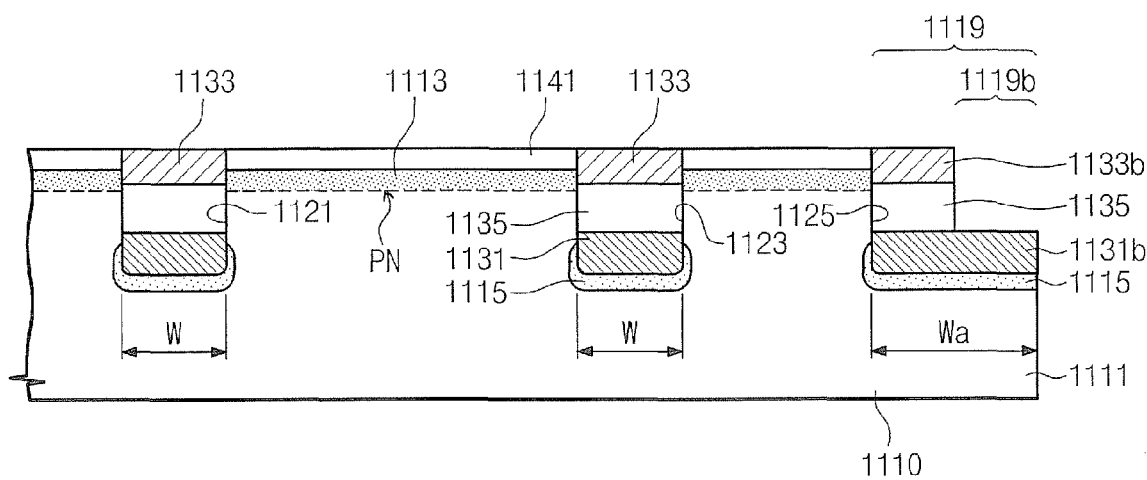
FIG. 13B is a cross-sectional view of the integrated circuit solar cell of FIG. 13A, taken along line I-I'.

According to additional embodiments of the present invention, the solar cell embodiment of FIGS. 10A-10C may be further modified, as illustrated by the solar cell embodiment of FIGS. 13A-13B. In particular, the solar cell embodiment of FIG. 13A-13B includes a modified patterning of the second electrode 1133 so that an upper surface of the second electrode 1133 is planar with the anti-reflective layer 1141. This planar surface profile may be achieved by planarizing the second electrode 1133 to be coplanar with the anti-reflective layer 1141. Moreover, an edge portion of the second electrode 1133 is provided as a ring-shaped extension 1133b. This extension 1133b defines a circular second edge region 1119b at a periphery of the semiconductor substrate 1110 that exposes an underlying surface of the first electrode 1131b. This circular second edge region 1119b has a width that is smaller than the width "Wa". The ring-shaped extension 1133b and the exposed underlying surface of the first electrode 1131b provide contact points for external electrodes (e.g., wire bonds, not shown) that supply solar generated current to a load (not shown) or photovoltaic system (see, e.g., FIG. 26).

Figure 14A:
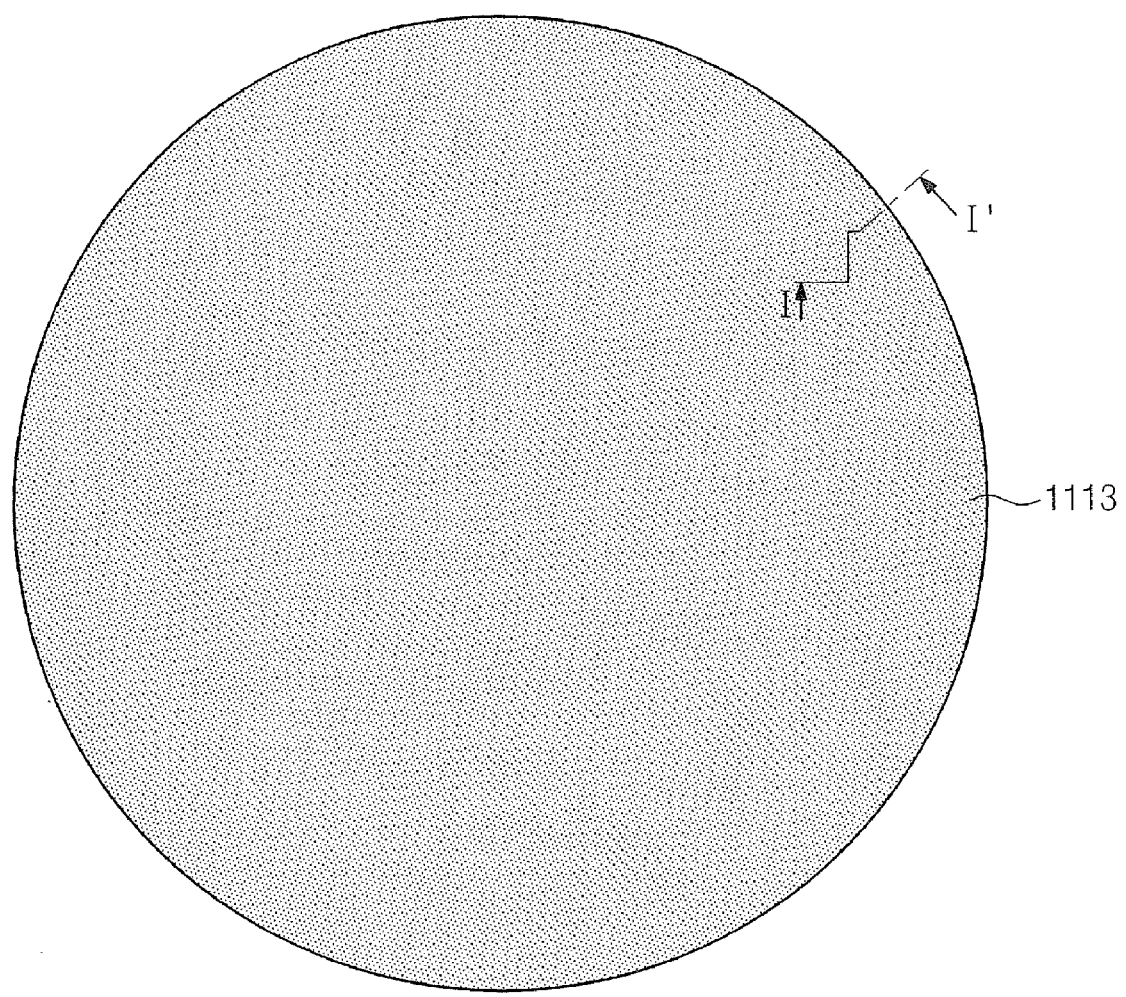
Figure 14B:
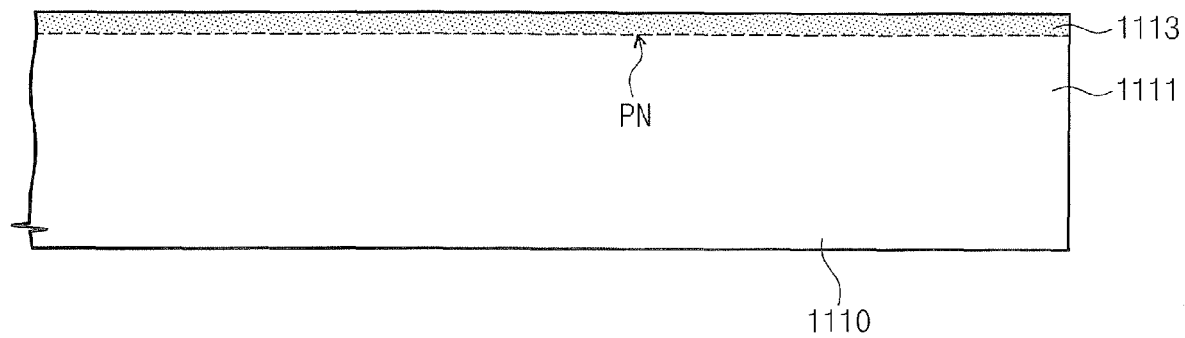

Methods of forming solar cells according to additional embodiments of the present invention are illustrated by FIGS. 14A-20A and 14B-20B, with FIGS. 14B-20B illustrating cross-sectional views of the intermediate structures of FIGS. 14A-20A taken along line I-I'. In particular, FIGS. 14A-14B illustrate the formation of a boundary layer 1113 and, in some embodiments, a combination of a boundary layer 1113 of second conductivity type (e.g., N-type) and semiconductor layer of second conductivity type 1114 (e.g., highly doped amorphous silicon layer, not shown), on the a base region 1111 of first conductivity type (e.g., P-type) therein. The boundary layer 1113 and the semiconductor layer of second conductivity type 1114 may be formed as described above with respect to FIGS. 10A-10B and 11, to thereby define a P-N rectifying junction. As illustrated by FIG. 11, a primary surface of the semiconductor substrate 1110 may have a textured surface profile.

Figure 15A:
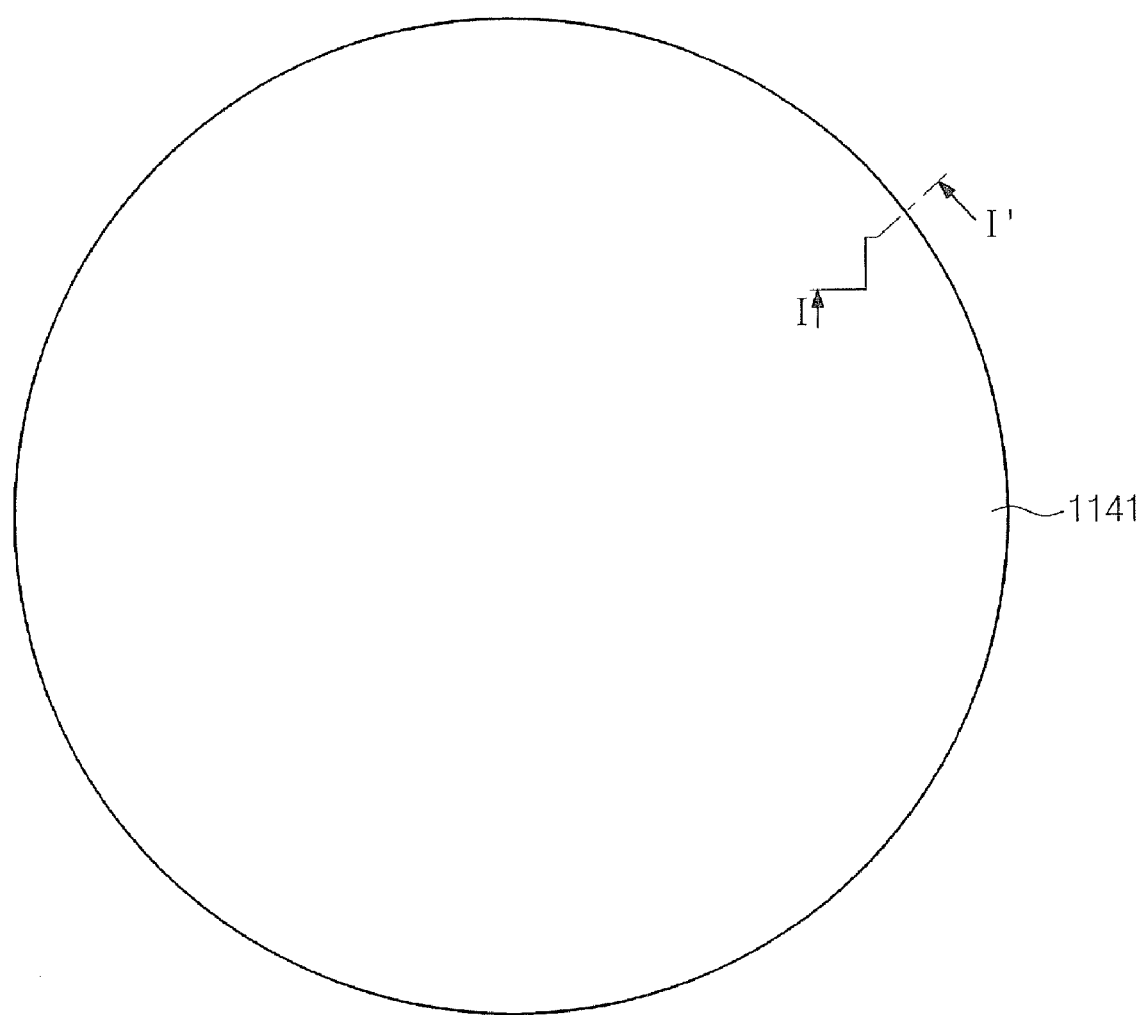
Figure 15B:
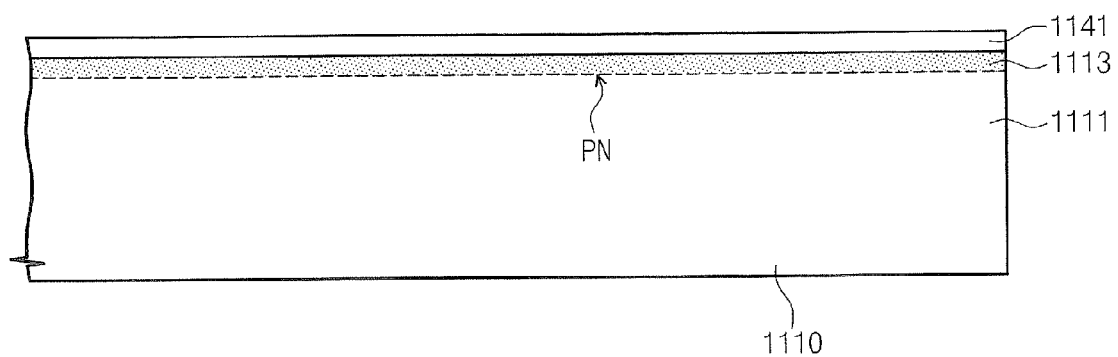
Figure 16A:
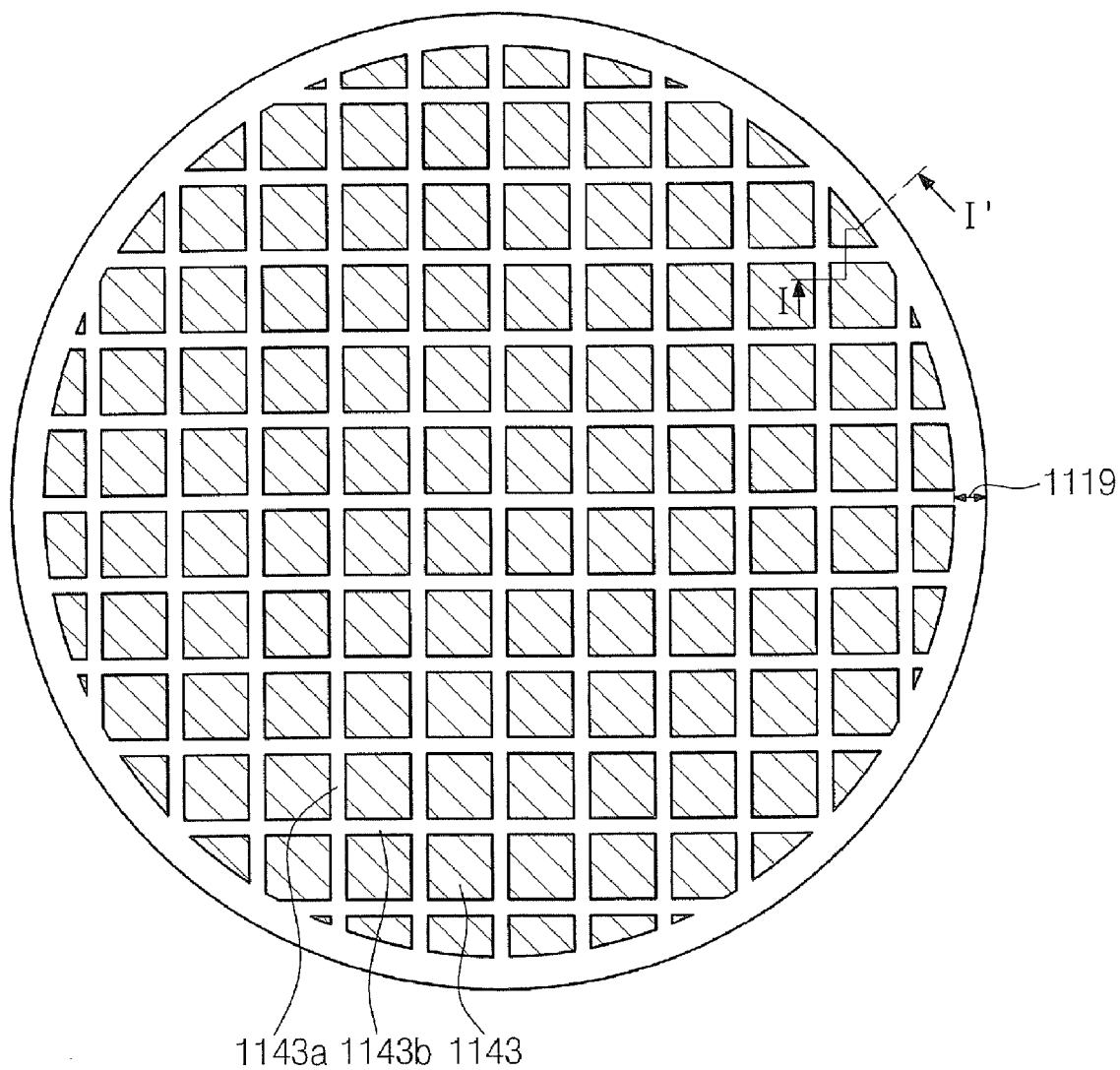
Figure 16B:
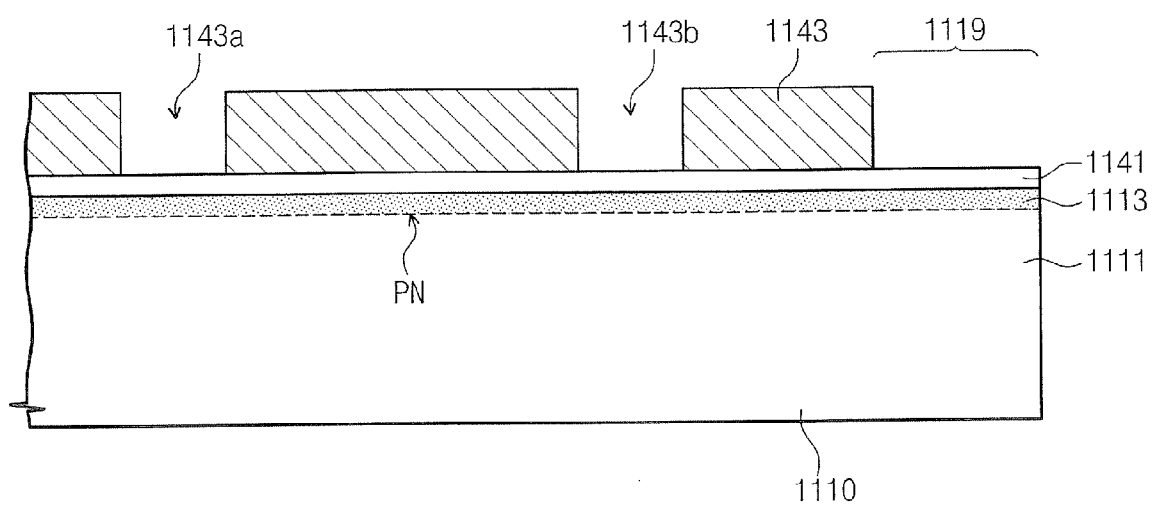

Referring now to FIGS. 15A-15B, an anti-reflective layer 1141 is formed on the boundary layer 1113 in order to increase the light collection efficiency of the solar cell. This anti-reflective layer 1141, which may be a silicon oxide layer, a silicon nitride layer or a combination thereof, may be formed using such processing techniques as plasma-enhanced chemical vapor deposition (PECVD). The anti-reflective layer 1141 may also be formed using conventional anti-reflective coating (ARC) layers. FIGS. 16A-16B illustrate the deposition of a photoresist layer 1143 on the anti-reflective layer 1141. This photoresist layer 1143 may be photolithographically patterned to define openings 1143a and 1143b therein. These openings may define a criss-crossing grid of intersecting openings, as illustrated by FIG. 16A. The photoresist layer 1143 may also be patterned to define the ring-shaped edge opening 1119.

Figure 17A:
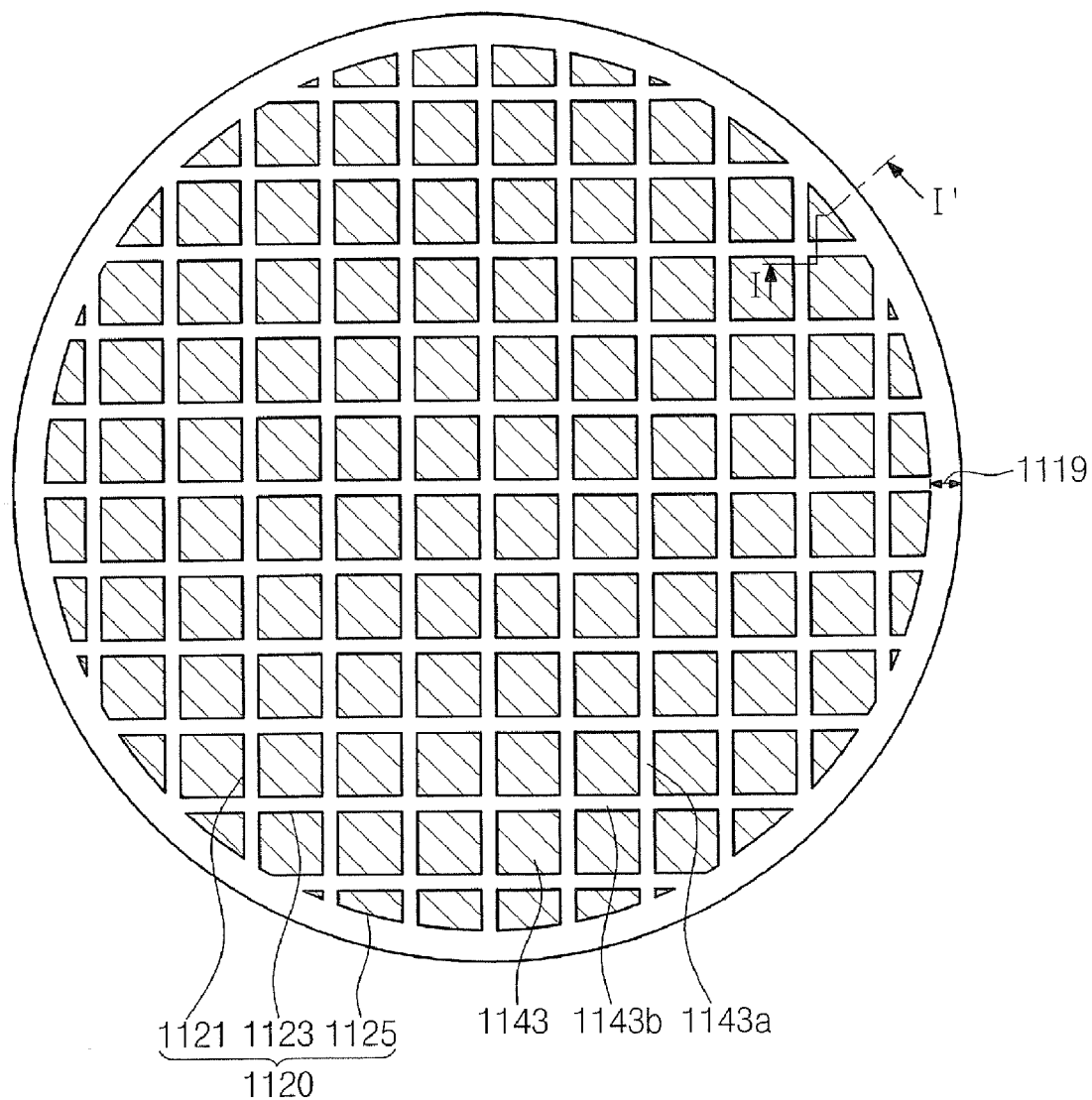
Figure 17B:
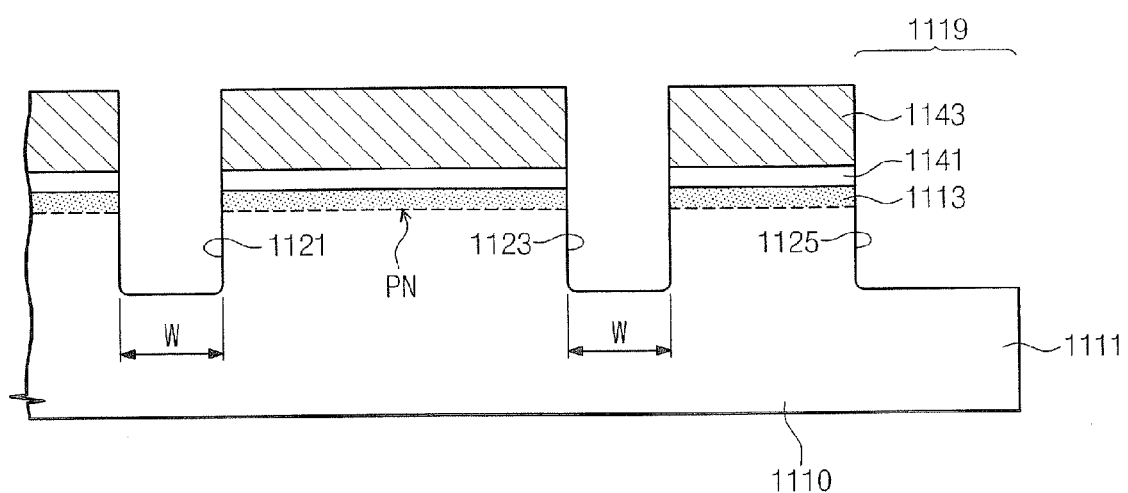

Referring now to FIGS. 17A-17B, a selective etching step is performed to define an array of trenches and a ring-shaped edge trench 1125 within the semiconductor substrate 1110, using the patterned photoresist layer 1143 as an etching mask. These trenches are illustrated collectively as a two-dimensional grid trench 1120. In particular, a plurality of first trenches 1121 and a plurality of second trenches 1123, which collectively form a criss-crossing array (i.e., two-dimensional grid) of trenches, are formed to extend entirely through the anti-reflective layer 1141 and the boundary layer 1113 and further extend into the base region 1111 of first conductivity type. According to some embodiments of the invention, the trenches may have a depth that is about two thirds a thickness of the semiconductor substrate 1110. As described above with respect to FIG. 10B, these trenches 1121 and 1123 may have a maximum width of about 1 µm, but typically have a narrower width of about 0.3 µm, for example.

Figure 18A:
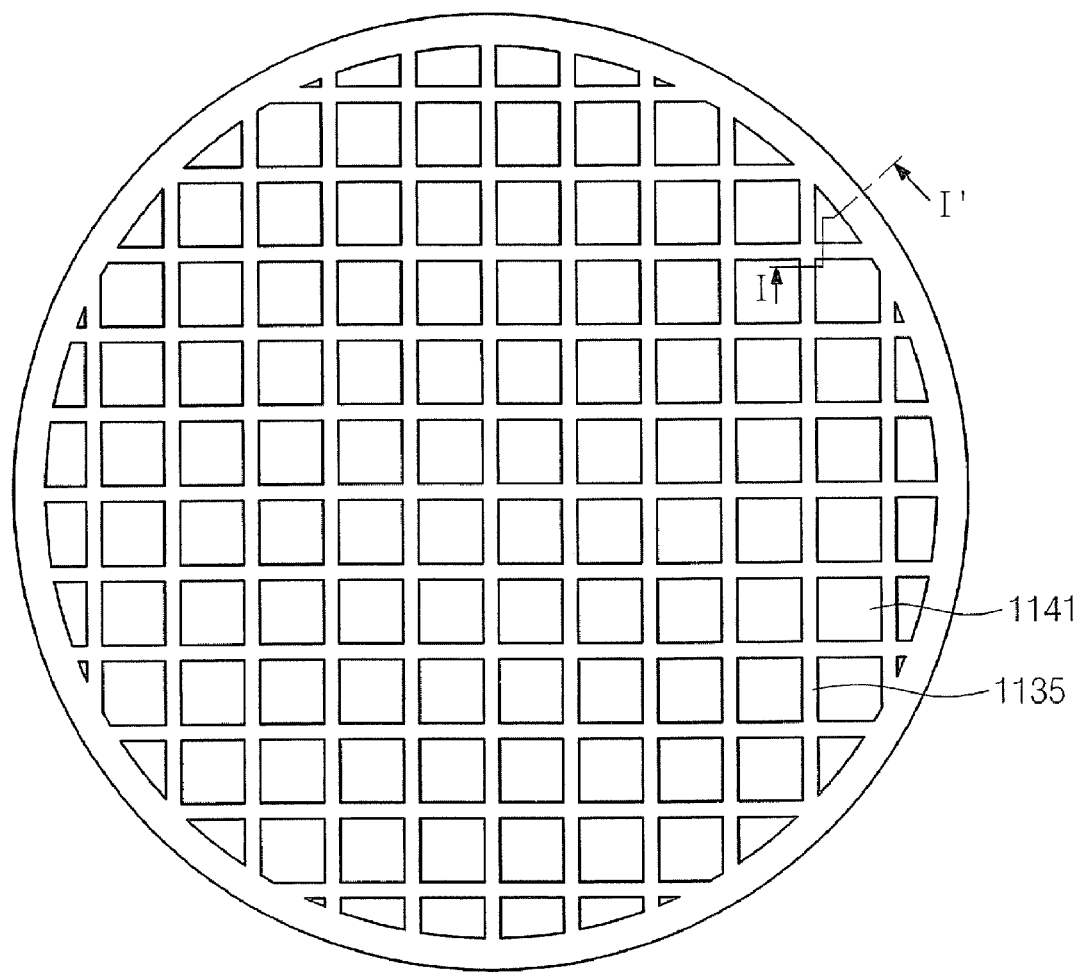
Figure 18B:
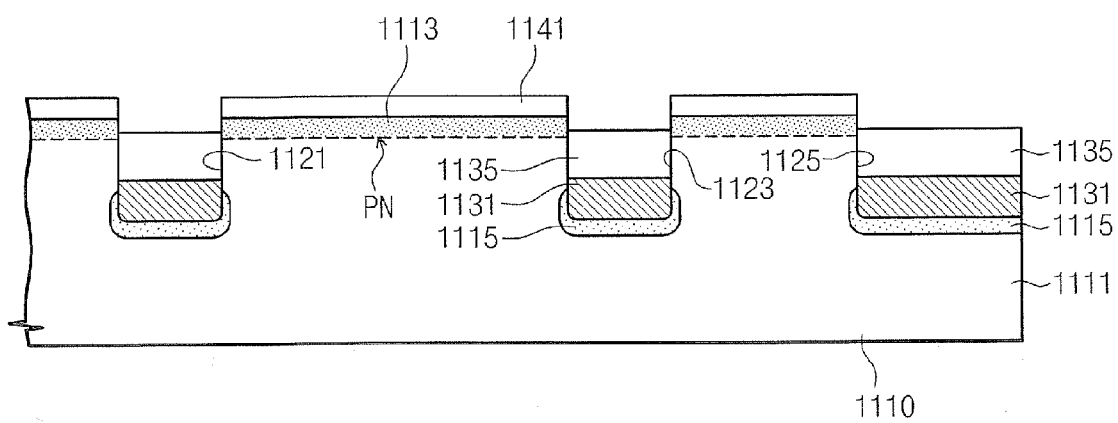

FIGS. 18A-18B illustrate the formation of impurity regions 1115 of first conductivity type adjacent bottoms of the trenches 1121, 1123 and 1125. These impurity regions 1115 may be formed by implanting first conductivity type dopants (e.g., boron) into the lower sidewalls and bottoms of the grid trench 1120, using the anti-reflective layer 1141 and/or the patterned photoresist layer 1143 as an implantation mask. According to some embodiments of the invention, the implantation of the first conductivity type dopants may be performed at a sufficient energy and dose to yield impurity regions 1115 having a higher first conductivity type dopant concentration therein relative to the base region 1111. Following this implantation step, a blanket electrically conductive layer (not shown) may be deposited onto the anti-reflective layer 1141 and into the grid trench 1120. This blanket electrically conductive layer may be formed of a material selected from a group consisting of aluminum (Al), copper (Cu), nickel (Ni), tungsten (W), titanium (Ti), titanium nitride (TiN), tungsten nitride (WN) and metal silicides and combinations of these electrically conductive materials. In particular, the blanket electrically conductive layer may be formed as a composite of Ti/TiN/Al or Ti/TiN/W. This blanket layer is then patterned to define the first electrode 1131 adjacent a bottom of the trenches 1121, 1123 and 1125. This patterning of the blanket layer may be performed as an anisotropic etching step that operates to selectively etch-back portions of the blanket layer. During the anisotropic etching step, the anti-reflective layer 1141 may operate as an etch-stop layer. As illustrated, the first electrode 1131 may have an upper surface (within the grid trench 1120) that is lower than the P-N junction interface between the base region 1111 and the boundary layer 1113.

Referring still to FIGS. 18A-18B, a blanket insulation layer (not shown) may be deposited onto the anti-reflective layer 1141 and into the grid trench 1120. This blanket insulating layer, which may be formed from an interlayer dielectric material such as silicon dioxide, is then selectively etched back to define the insulation layer 1135 within the grid trench 1120. This etch back step may be performed without requiring photolithography. For example, an anisotropic etching step may be performed using the anti-reflective layer 1141 as an etch stop layer. After etch-back, the insulation layer 1135 may have a top surface lower than a top surface of the boundary layer 1113, as illustrated.

Figure 19A:
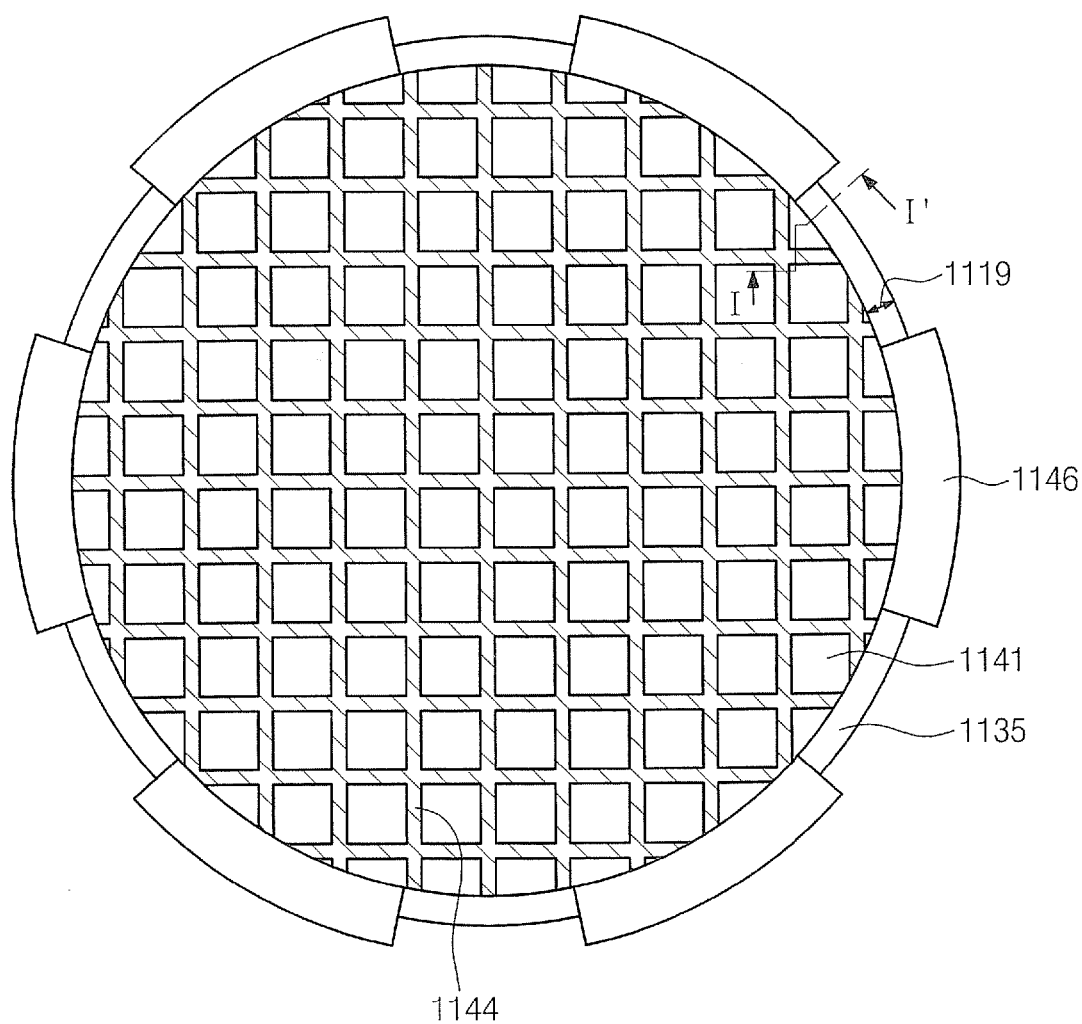
Figure 19B:
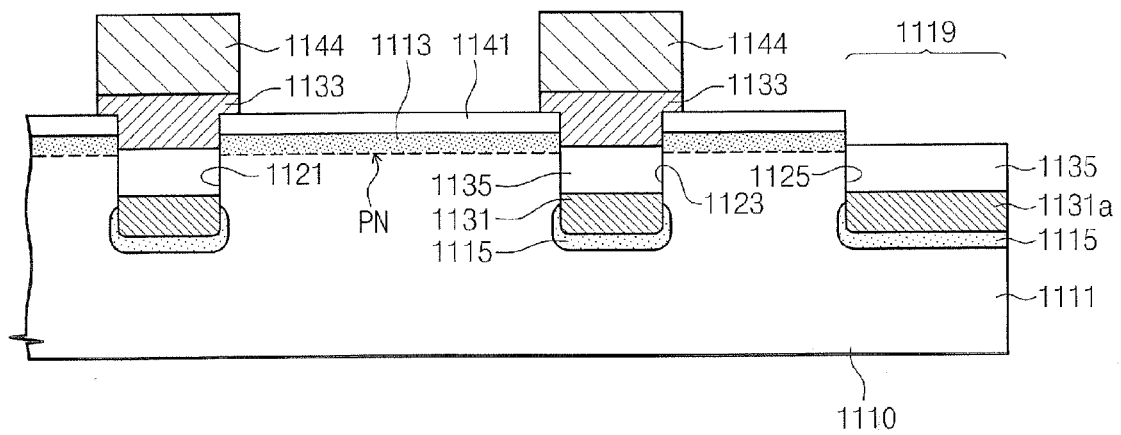

Referring now to FIGS. 19A-19B, another electrically conductive layer (not shown) is conformally deposited as a blanket layer onto the anti-reflective layer 1141 and onto the insulation layer 1135. As described above, this electrically conductive layer may be formed of a material selected from a group consisting of aluminum (Al), copper (Cu), nickel (Ni), tungsten (W), titanium (Ti), titanium nitride (TiN), tungsten nitride (WN) and metal silicides and combinations of these electrically conductive materials. A photoresist layer (not shown) may be deposited on the electrically conductive layer and then patterned to define a photoresist mask 1144. This photoresist mask 1144 is then used during an etching step to define the second electrode 1133. The anti-reflective layer 1141 may again be used as an etch-stop layer. During the process of forming the second electrode 1133, at least a portion of the edge region 1119 may be covered with a hard mask 1146, so as to define a second electrode 1133a adjacent a periphery of the substrate 1110, as illustrated by FIG. 10A. A portion of the insulation layer 1135 within the edge region 1119 may be exposed by the photoresist mask 1144 and the hard mask 1146, as illustrated by FIG. 19B.

Figure 20A:
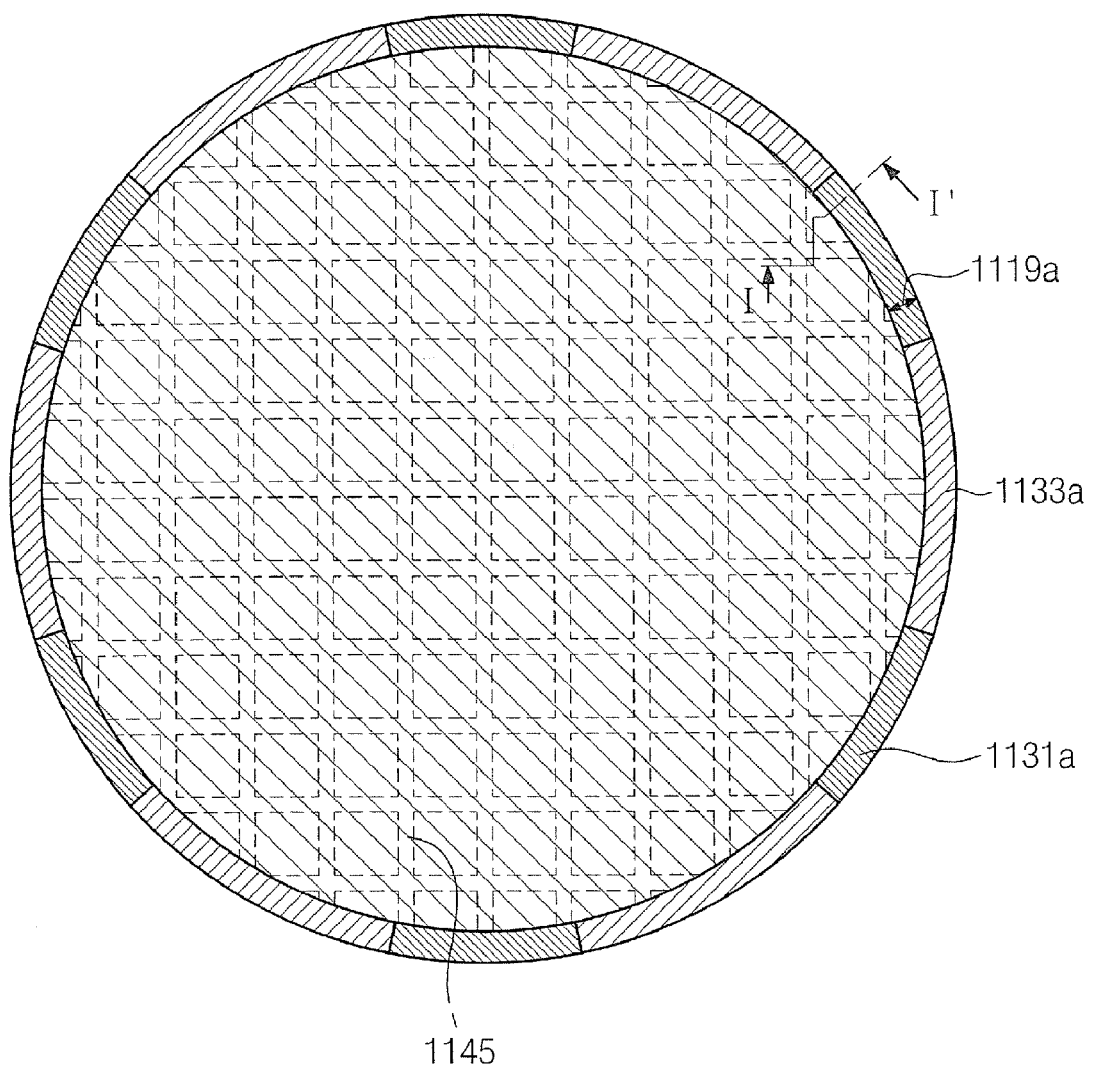
Figure 20B:
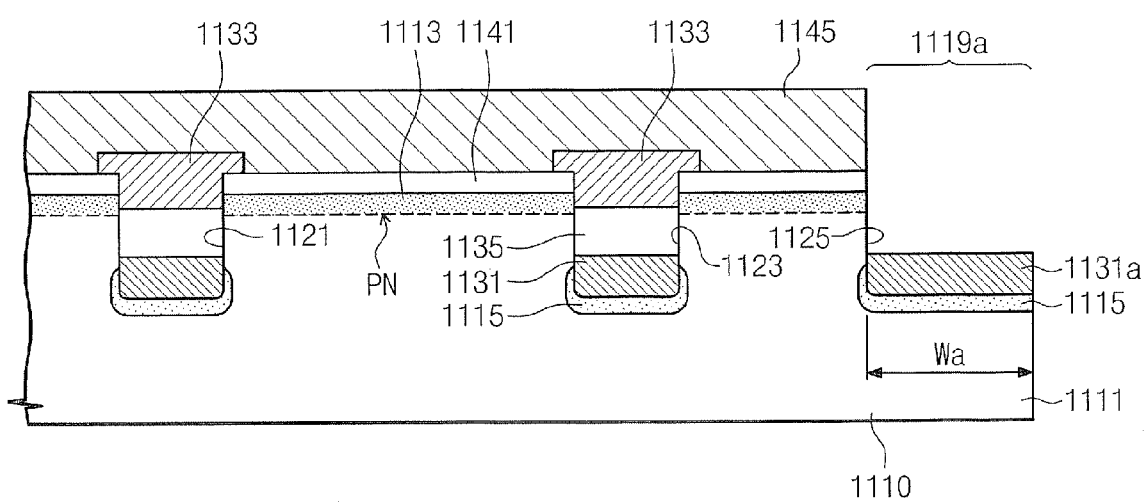

Referring now to FIGS. 20A-20B, the photoresist mask 1144 and the hard mask 1146 may be removed and another photoresist layer (not shown) may be formed. This photoresist layer may then be patterned (e.g., using wet etching) to define another photoresist mask 1145, which exposes the first edge region 1119a. A dry etching step may then be performed to selectively remove exposed portions of the insulation layer 1135 and thereby expose underlying portions of the first electrode 1131a extending adjacent a periphery of the semiconductor substrate 1110. These exposed underlying portions of the first electrode 131a may serve as contact points for external wiring (e.g., wire bond) connections.

Figure 21A:
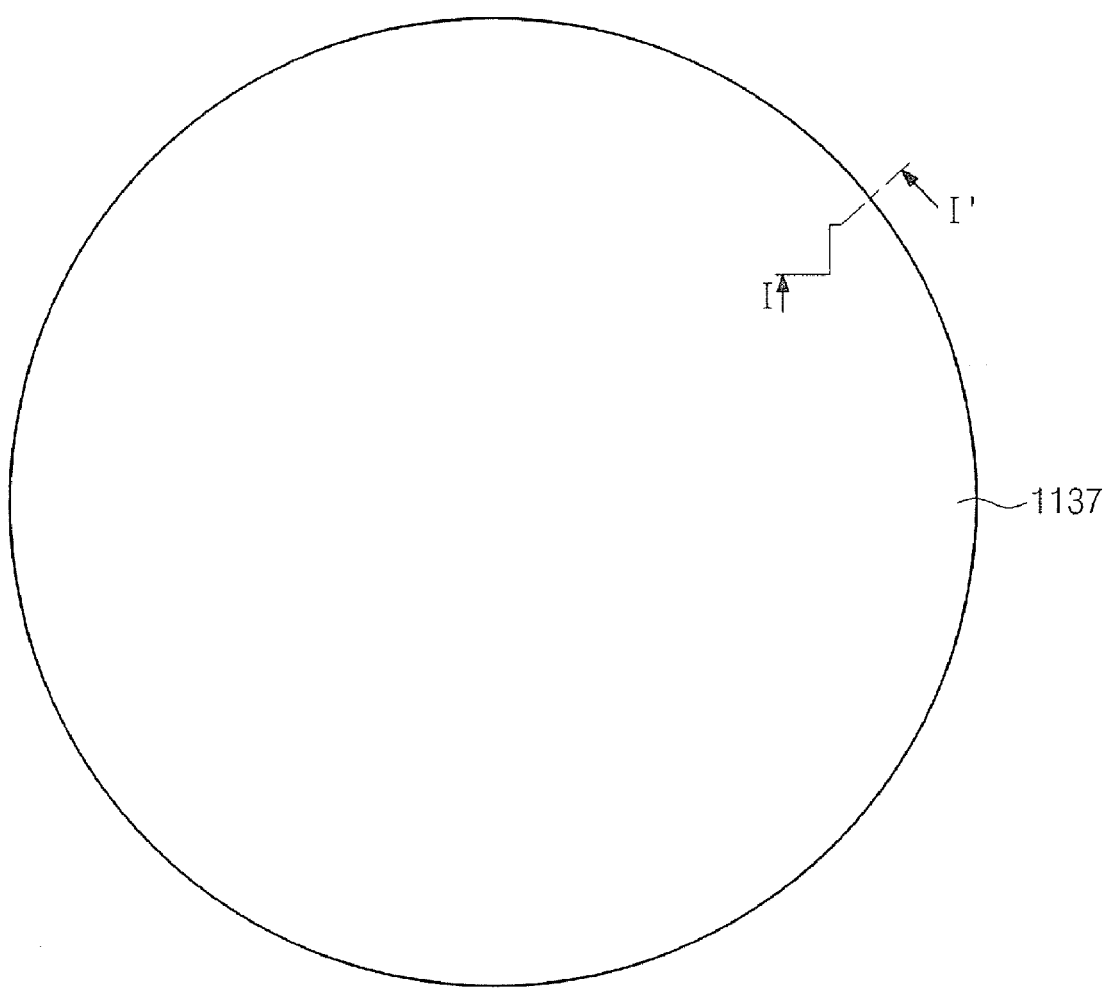
Figure 21B:
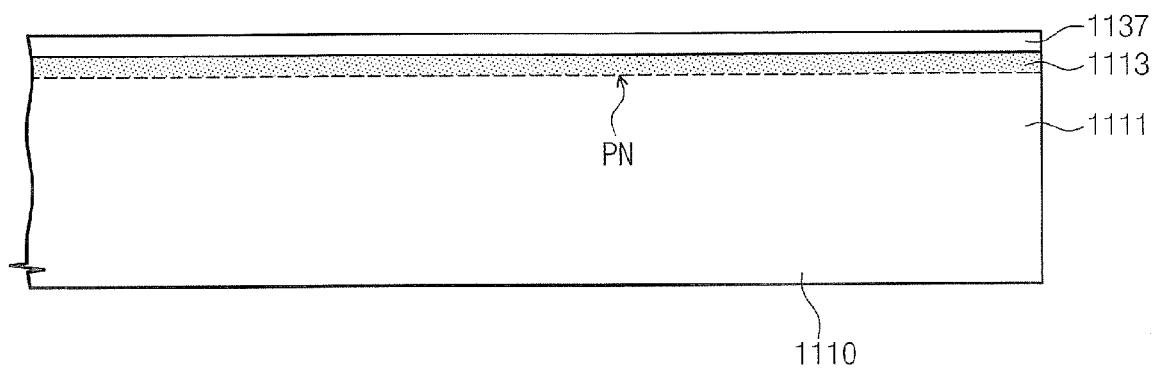
Figure 22A:
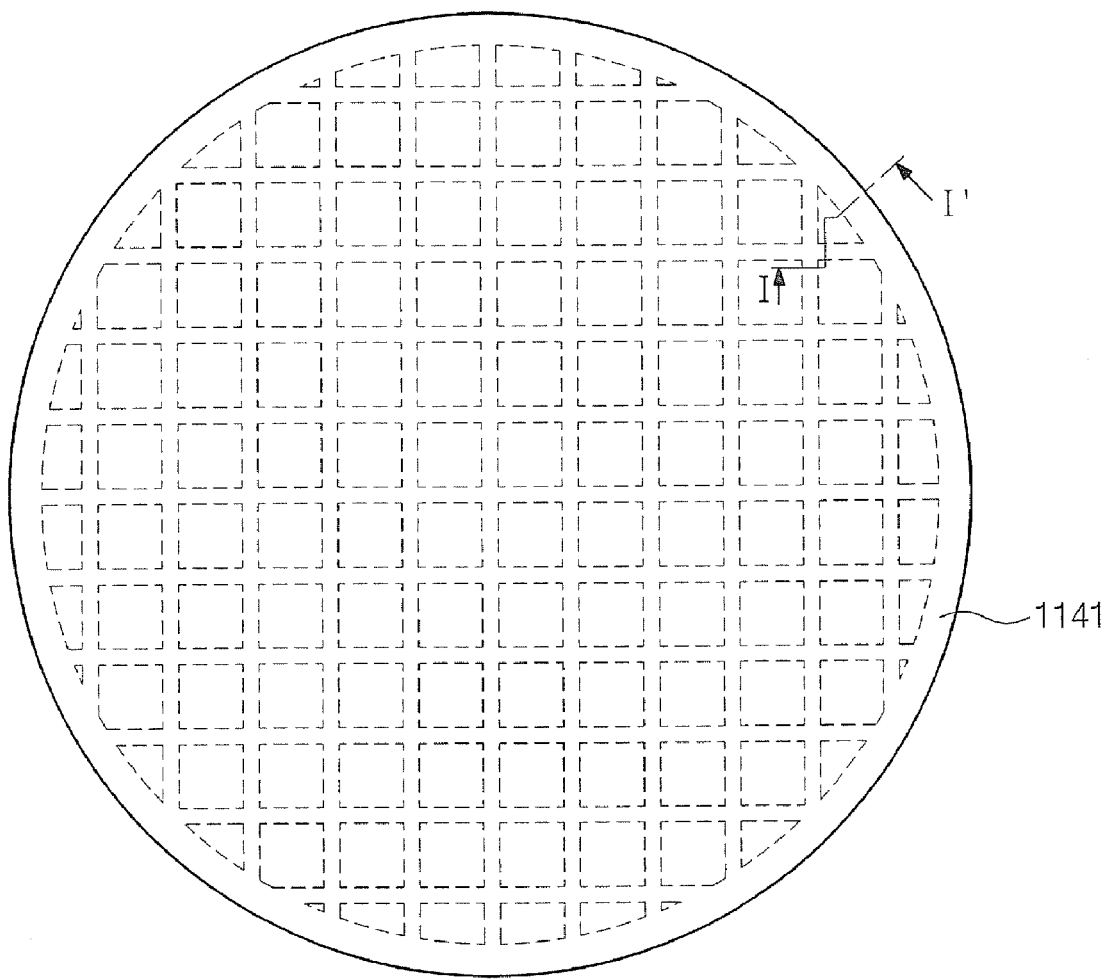
Figure 22B:
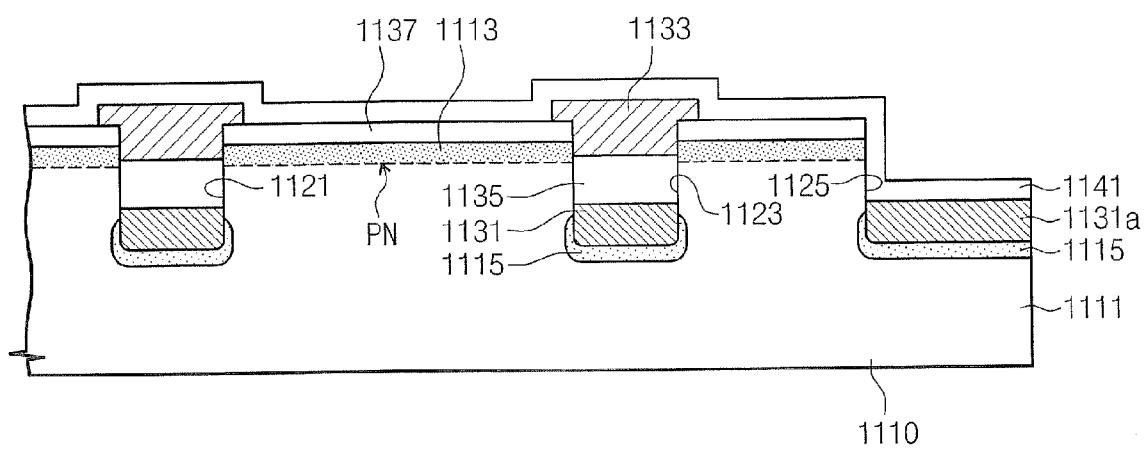
Figure 23A:
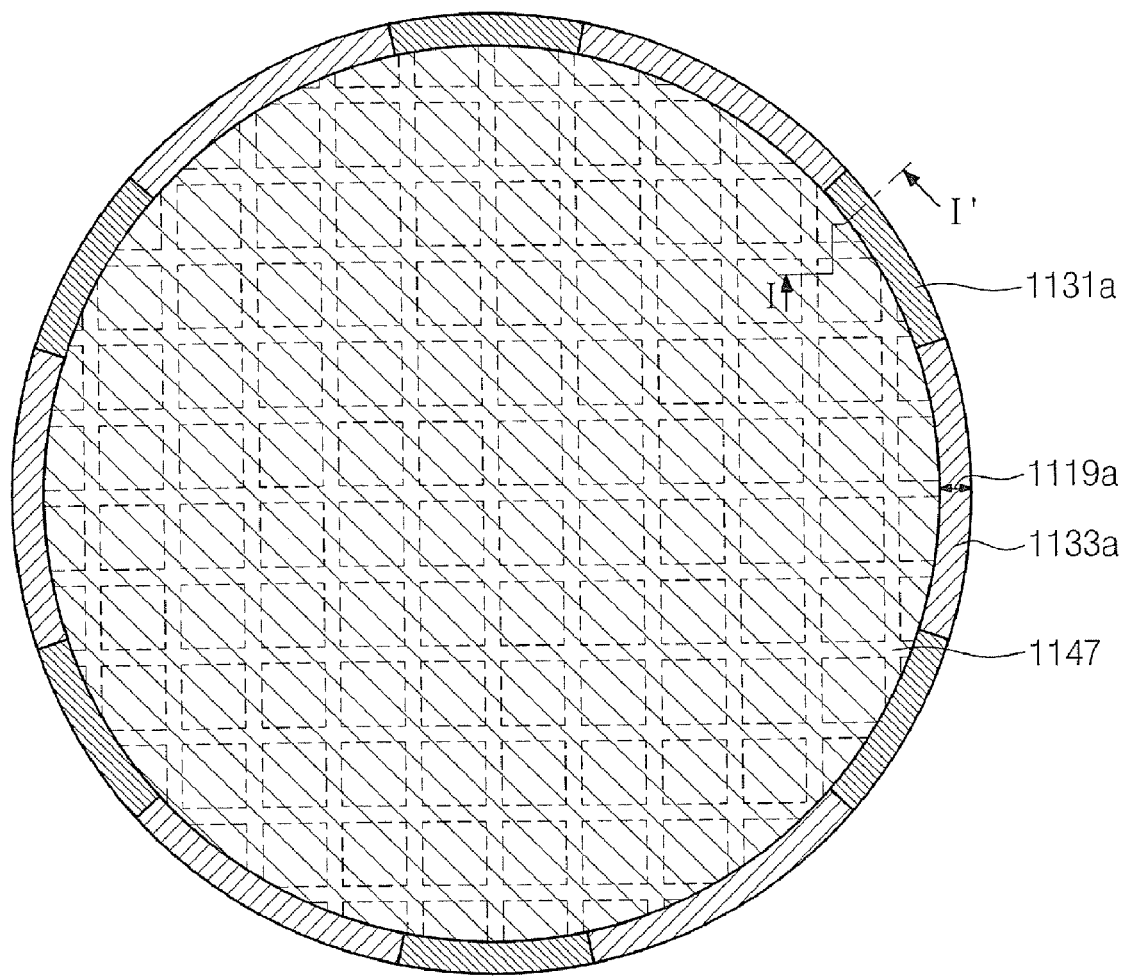
Figure 23B:
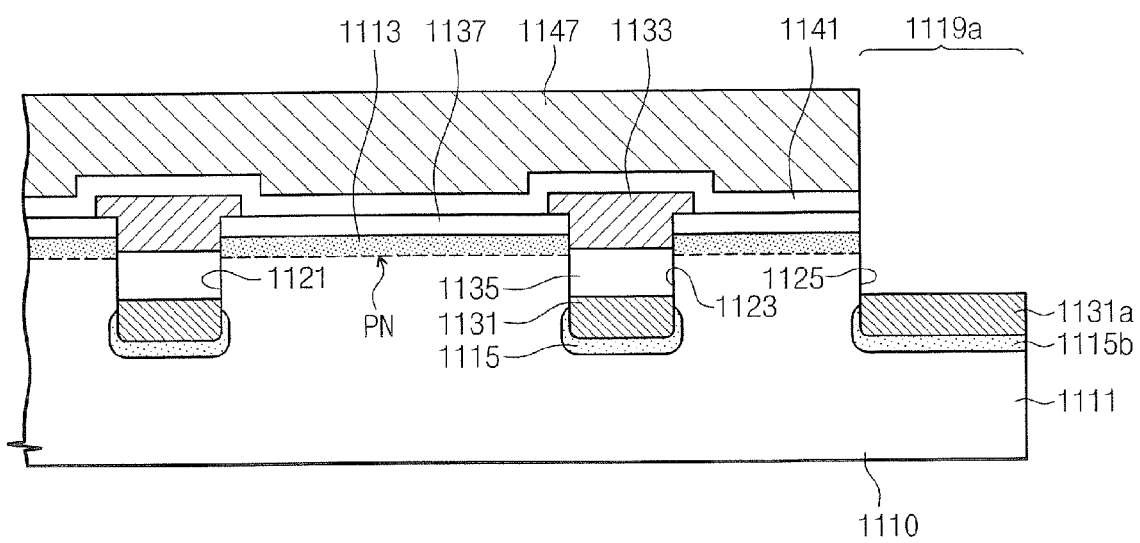

Still further method embodiments of the present invention are illustrated by FIGS. 21A-23A and 21B-23B. In particular, FIGS. 21A-21B illustrate the inclusion of an optically transparent conductive layer 1137 on the boundary layer 1113. Thereafter, as illustrated by FIGS. 22A-23A, 22B-23B, 12A and 12C, an anti-reflective layer 1141 may be conformally deposited on the substrate 1110. A patterned photoresist layer 1147 is formed on the anti-reflective layer 1141, as illustrated by FIGS. 23A-23B. This patterned photoresist layer 1147 is then used as a mask during a step to selectively etch back exposed portions of the anti-reflective layer 1141 and the optically transparent conductive layer 1137, to thereby reveal corresponding underlying portions of the first electrode 1131a adjacent the periphery of the substrate 1110. The patterned photoresist layer 1147 is then removed, as shown by FIG. 12C.

Figure 24A:
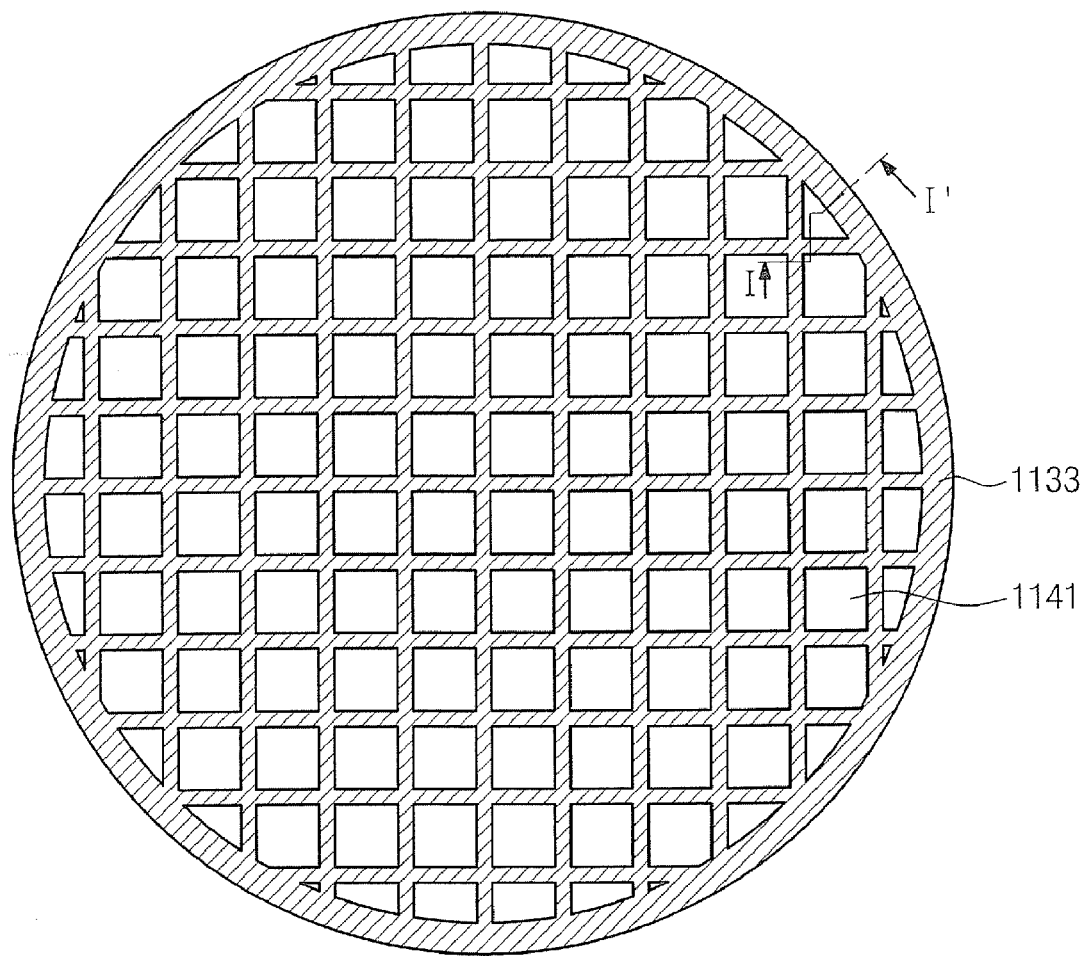
Figure 24B:
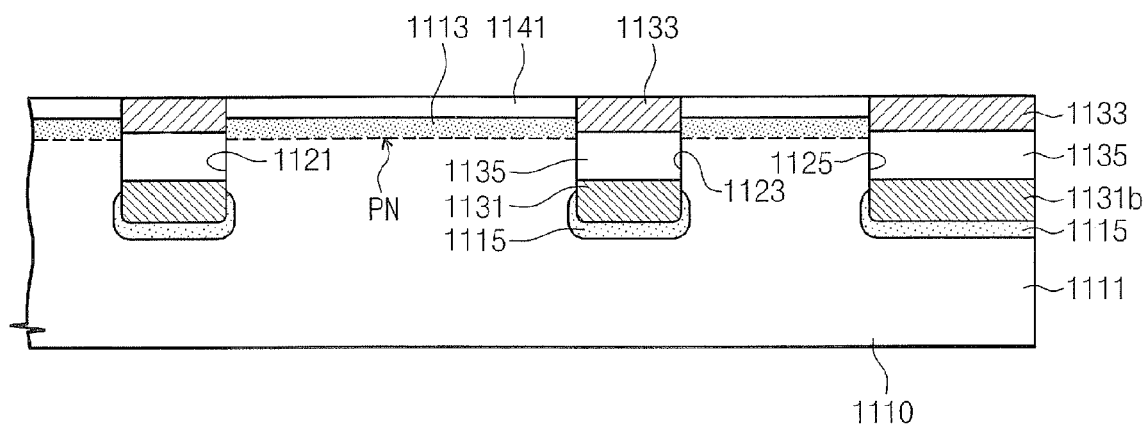

According to additional embodiments of the present invention, the solar cell embodiment of FIGS. 13A-13B may be formed using the steps illustrated by FIGS. 24A-25A, 24B-25B. For example, the methods of forming a solar cell may include modified steps to pattern the second electrode 1133 so that an upper surface of the second electrode 1133 is planar with the anti-reflective layer 1141. This planar surface profile may be achieved by planarizing the second electrode 1133 to be coplanar with the anti-reflective layer 1141, as illustrated by FIG. 24B.

Figure 25A:
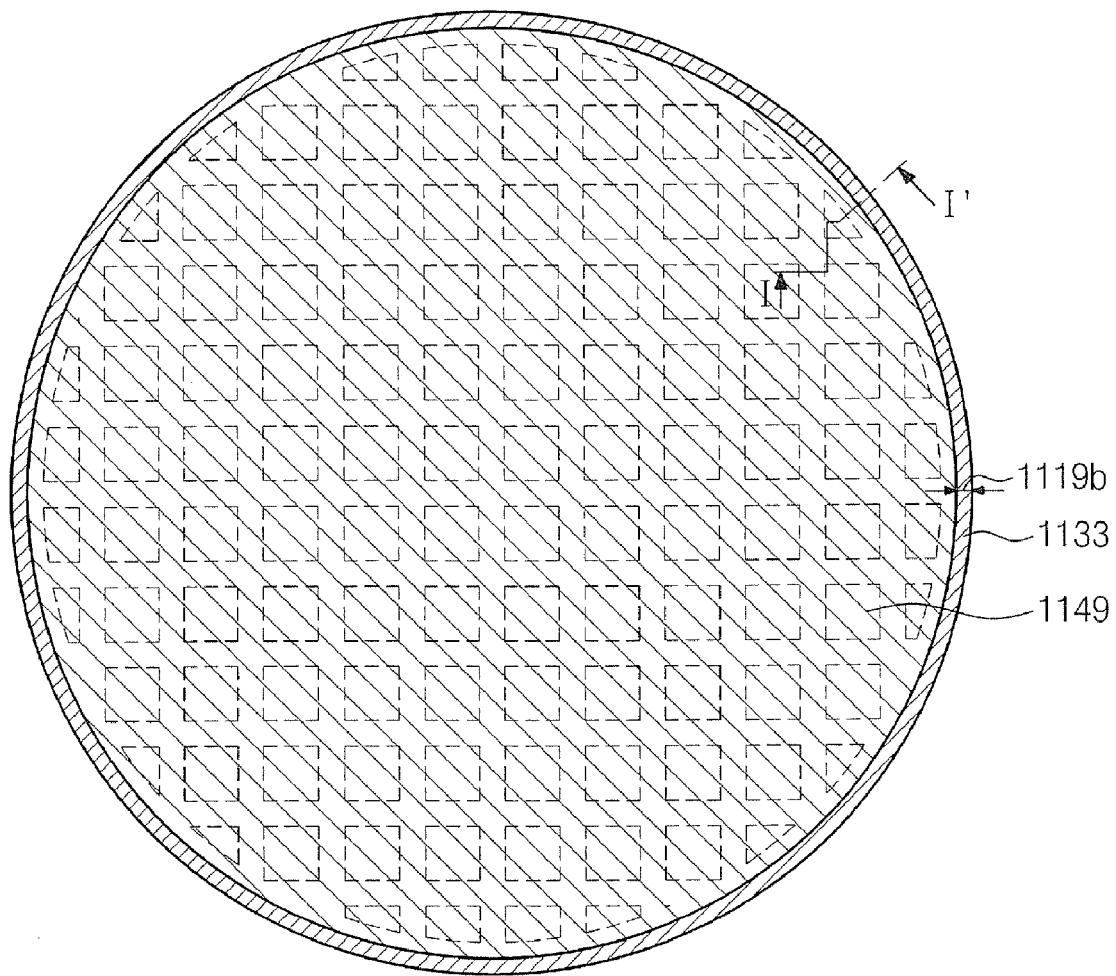
Figure 25B:
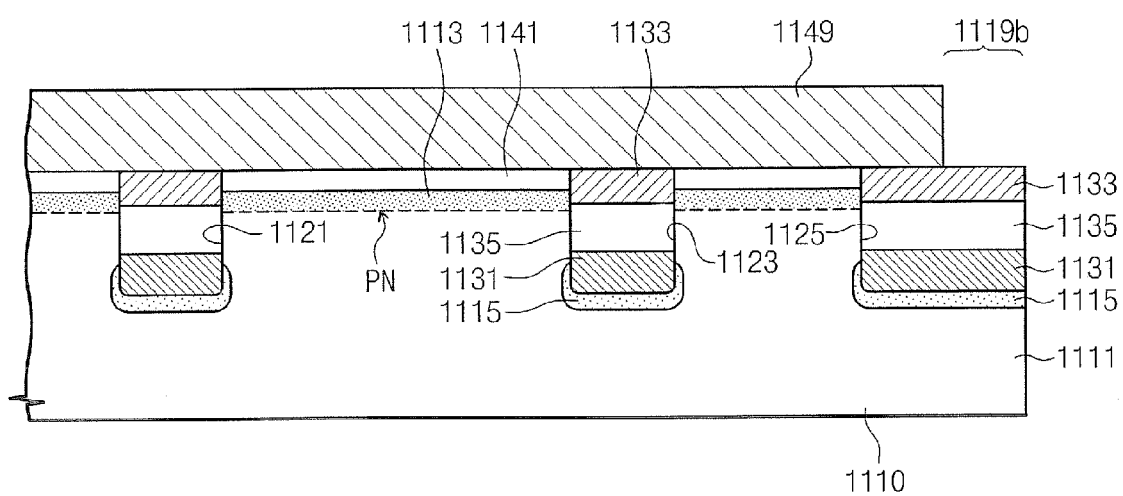

An edge portion of the second electrode 1133 is provided as a ring-shaped extension 1133b. This extension 1133b, which is shown by FIG. 13B, defines a circular second edge region 1119b at a periphery of the semiconductor substrate 1110, which exposes an underlying surface of the first electrode 1131b. This circular second edge region 1119b has a width that is smaller than the width "Wa" in FIG. 10B. This circular second edge region 1119b may be defined by forming a patterned photoresist layer 1149 on the planarized surface of the second electrode 1133 and the anti-reflective layer 1141, as illustrated by FIGS. 25A-25B. Thereafter, as illustrated by FIGS. 13A-13B, the exposed portions of the second electrode 1133 and underlying portions of the insulation layer 1135 are selectively removed so that a narrower upper surface of the first electrode 1131b can be exposed. This solar cell embodiment of FIGS. 13A-13B potentially provides greater efficiency relative to the solar cell embodiment of FIGS. 10A-10B, by increasing the total contact area between the second electrode 1133, 1133b and the boundary layer 1113.

Figure 26:
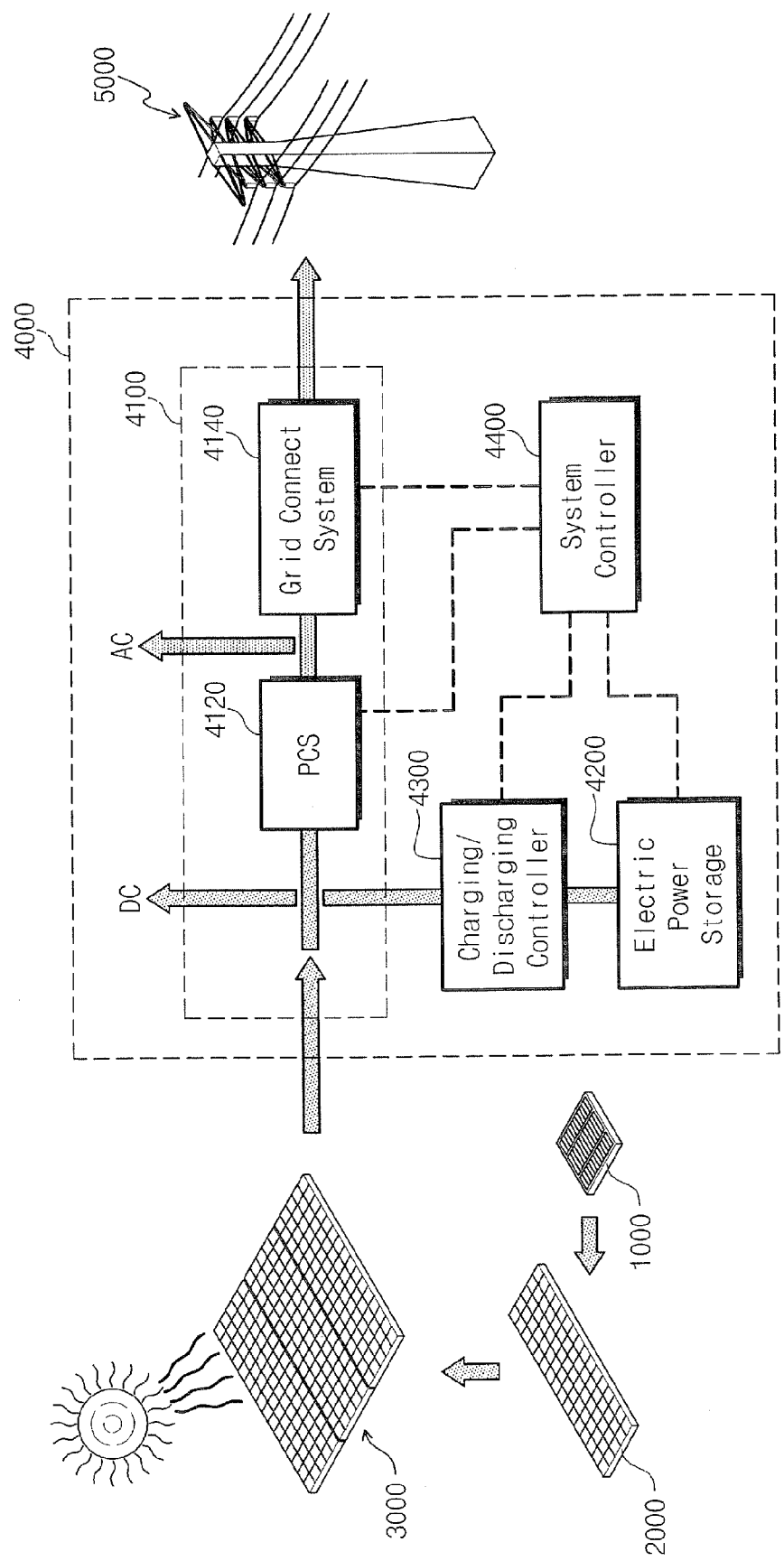
FIG. 26 is a block diagram of a photovoltaic system that can use integrated circuit solar cells according to embodiments of the present invention.

Referring now to FIG. 26, the solar cell embodiments of the present invention described hereinabove may be used within a power control network 4000 that receives power from a solar cell array 3000. As illustrated, each solar cell array 3000 may be configured as a plurality of solar cell modules 2000, with each module including an array of solar cells 1000. In this manner, the relatively low voltage and/or current provided by each solar cell 1000 may be combined with the voltages and/or currents provided by other solar cells 1000 to thereby generate a relatively large power source. The power control network 4000 is illustrated as including an output device 4100, a power storage device 4200, a charging/discharging controller 4300, and a system controller 4400, which controls the power storage device 4200, the charging/discharging controller 4300, the power conditioning system (PCS) 4120 and the grid connect system 4140. The output device 4100 may include a power conditioning system (PCS) 4120 and a grid connect system 4140. The PCS 4120 may be an inverter that operates to convert direct current (DC) from the solar cell array 3000 to an alternating current (AC). The grid connect system 4140 may be connected to an external power system 5000. The charging/discharging controller 4300 operates to transfer excess energy to the power storage device 4200 when an output generated by the solar cell array 3000 exceeds the power output to the external power system 5000. Alternatively, the charging/discharging controller 4300 operates to withdraw energy from the power storage device 4200 when an output generated by the solar cell array 3000 is insufficient to meet the demands of the external power system 5000.

Figure 27A:
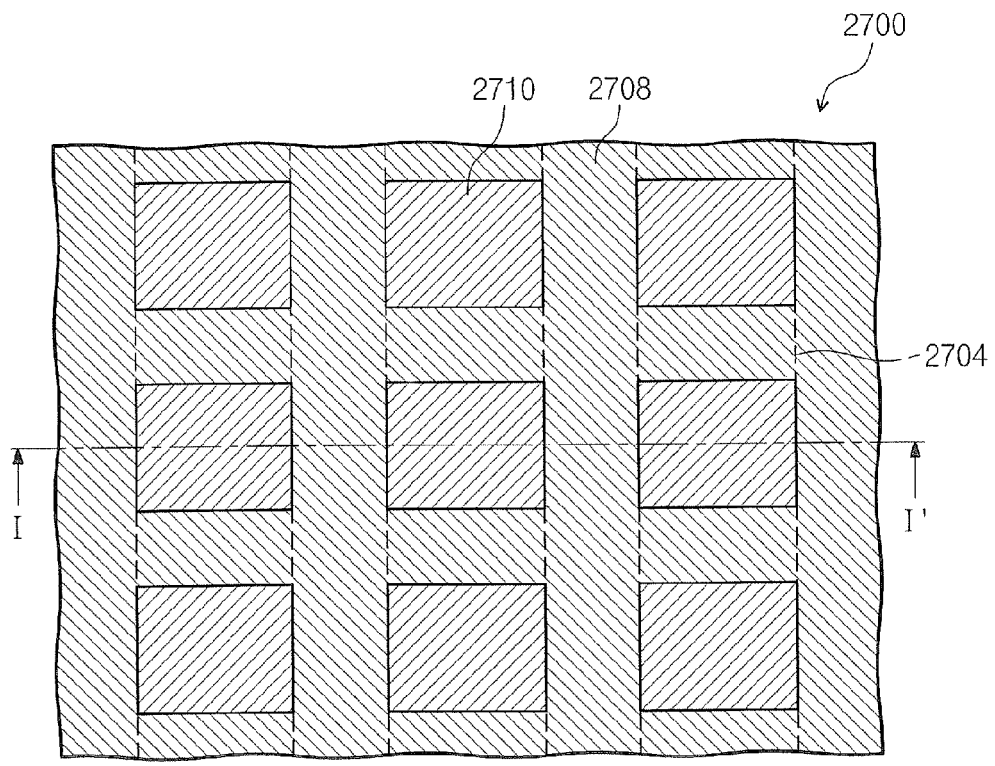
FIG. 27A is a plan view of an integrated circuit solar cell according to an embodiment of the present invention.
Figure 27B:
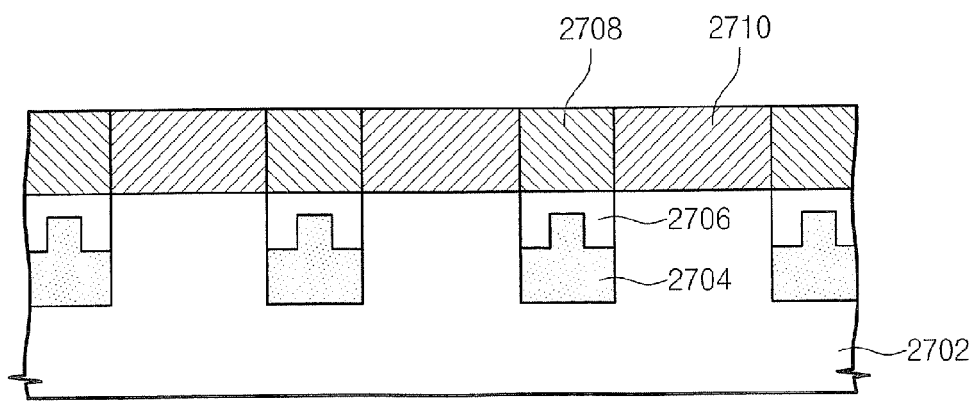
FIG. 27B is a cross-sectional view of the solar cell embodiment of FIG. 27A, taken along line I-I'.

The above-described embodiments of the invention may be fabricated to have a variety of electrode configurations and patterns that support high efficiency collection of charge carriers in response to incident light received on a primary surface of a solar cell. For example, FIG. 27A is a plan view of an integrated circuit solar cell 2700 according to an additional embodiment of the present invention and FIG. 27B is a cross-sectional view of the solar cell 2700 of FIG. 27A, taken along line I-I'. As illustrated by these figures, the solar cell 2700 includes a two-dimensional array of second conductivity type regions 2710 (shown as square regions), which may have an N-type conductivity, surrounded by a top surface electrode 2708. Each of the second conductivity type regions 2710 forms respective P-N rectifying junctions with a substrate region 2702, which may have P-type conductivity. Electrical contacts to the P-type substrate region 2702 may be made by a trench-based electrode 2704, which is located at the bottoms of a mesh-shaped trench, as illustrated by FIG. 27B. The mesh-shaped top surface electrode 2708 is electrically isolated from the underlying trench-based electrode 2704 by an intervening trench-based electrically insulating layer 2706 (e.g., silicon dioxide), which may have an upper surface that is planar with an upper surface of the substrate region 2702 on which the top surface electrode 2708 and N-type regions 2710 are formed.

Figure 28A:
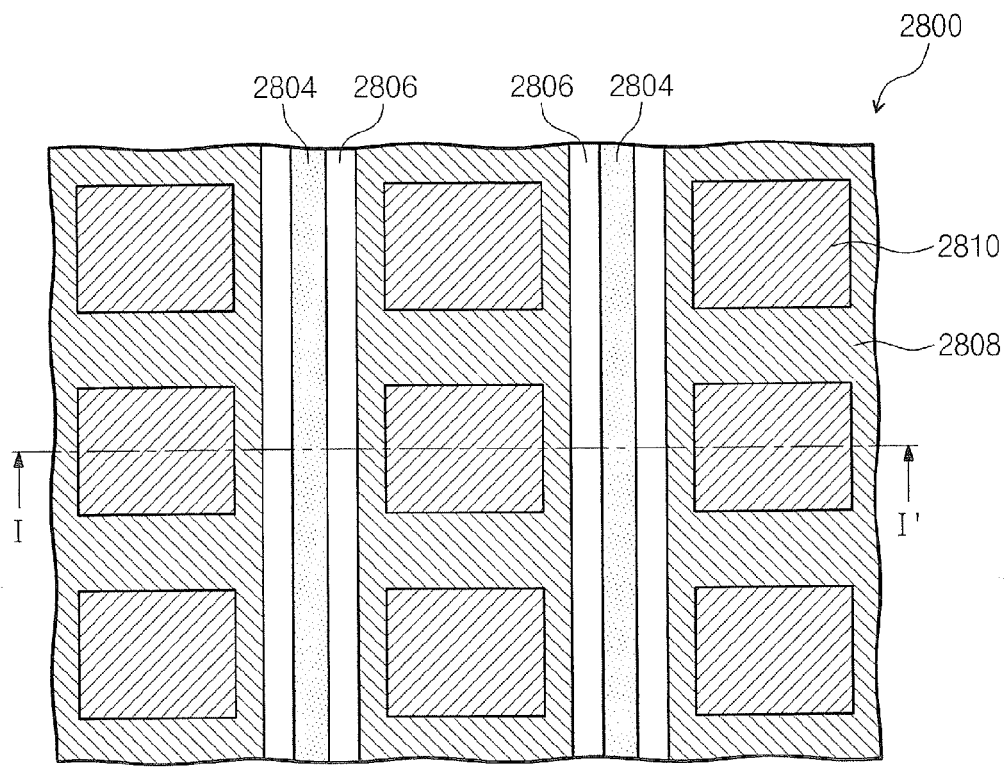
FIG. 28A is a plan view of an integrated circuit solar cell according to an embodiment of the present invention.
Figure 28B:
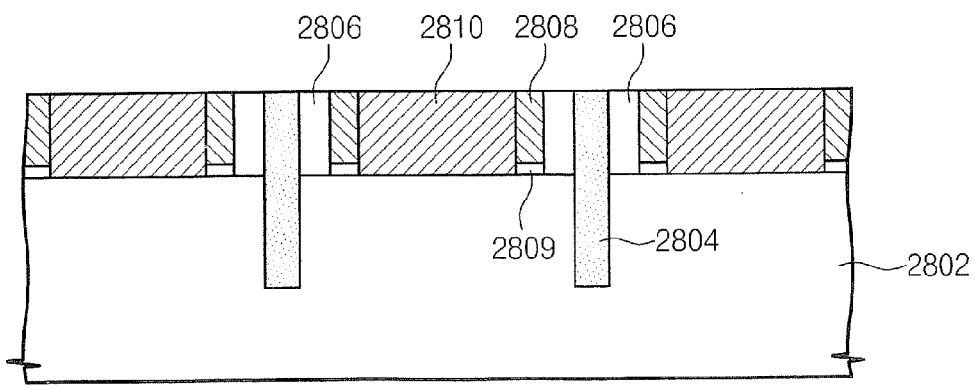
FIG. 28B is a cross-sectional view of the solar cell embodiment of FIG. 28A, taken along line I-I'.

FIG. 28A is a plan view of an integrated circuit solar cell 2800 according to an additional embodiment of the present invention and FIG. 28B is a cross-sectional view of the solar cell 2800 of FIG. 28A, taken along line I-I'. As shown by the plan view of FIG. 28A, the solar cell 2800 is similar to the solar cell 2700 of FIG. 27A, however, the trench based electrode 2804 (see, e.g., FIG. 28B) is illustrated as extending upwards to an uppermost light receiving surface of the solar cell 2800. In particular, FIG. 28B illustrates a P-type substrate region 2802 having a plurality of N-type regions 2810 thereon that form respective P-N rectifying junctions with the substrate region 2802. Electrical contact is made to the N-type regions 2810 using a plurality of top surface electrodes 2808 and electrical contacts are made to the P-type substrate region 2802 by the trench based electrodes 2804, which are illustrated as stripe-shaped electrodes that extend in parallel across the solar cell 2800. As further illustrated by FIG. 28B, the trench based electrodes 2804 and the top surface electrodes 2808 are electrically isolated from each other by electrically insulating layers 2806 that extend adjacent the light receiving surface of the solar cell 2800. The top surface electrodes 2808 are also electrically isolated from the underlying substrate region 2802 by electrically insulating spacers 2809, which are disposed underneath the top surface electrodes 2808.

Figure 29A:
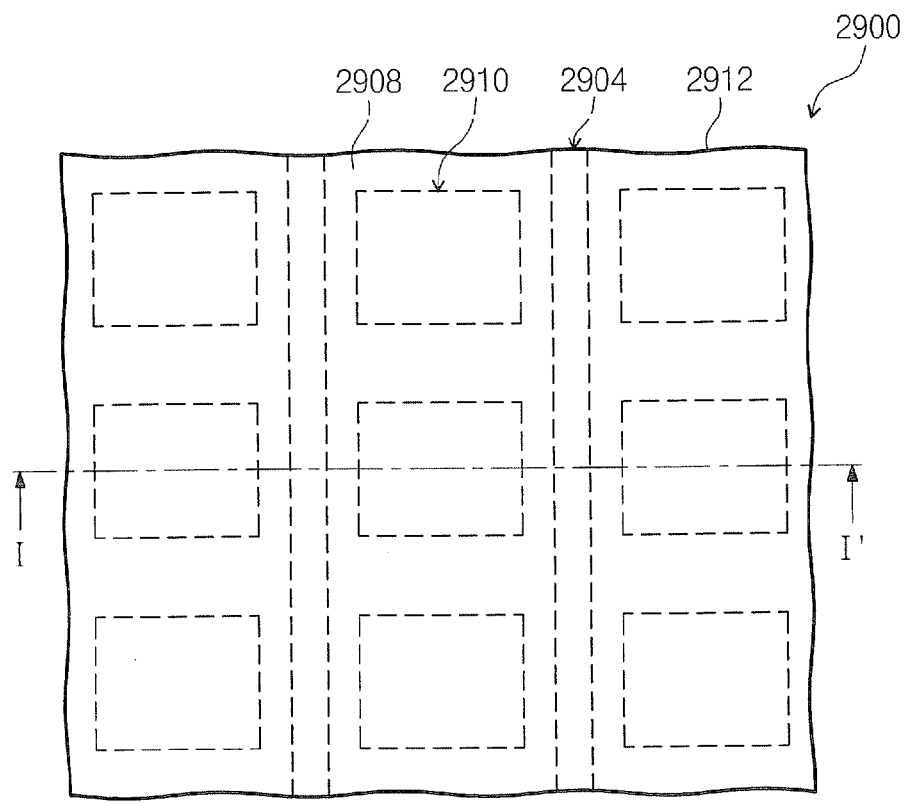
FIG. 29A is a plan view of an integrated circuit solar cell according to an embodiment of the present invention.
Figure 29B:
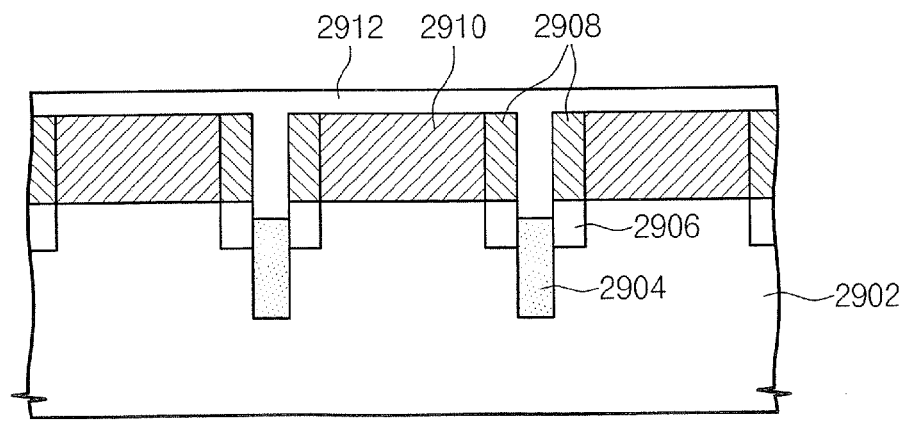
FIG. 29B is a cross-sectional view of the solar cell embodiment of FIG. 29A, taken along line I-I'.

FIG. 29A is a plan view of an integrated circuit solar cell 2900 according to an additional embodiment of the present invention and FIG. 29B is a cross-sectional view of the solar cell 2900 of FIG. 29A, taken along line I-I'. As shown by FIGS. 29A-29B, the solar cell 2900 is similar to the solar cell embodiment of FIGS. 28A-28B, however, the electrically insulating layers 2906 are moved into the substrate region 2902, on opposite sides of upper portions of the trench based electrodes 2904. The top surface electrodes 2908 are provided on upper surfaces of the electrically insulating layers 2906, which enables the N-type regions 2910 in FIG. 29B to be larger than the N-type regions 2810 in FIG. 28B. Thus, the solar cell embodiment of FIGS. 29A-29B may have a greater light collection efficiency relative to the solar cell embodiment of FIGS. 28A-28B. The solar cell embodiment of FIGS. 29A-29B may also include an optically transparent insulating layer 2912 that is conformally deposited on the N-type regions 2910 and into spaces between adjacent electrodes 2908, as illustrated, so that a planar surface profile is provided adjacent the light collecting surface of the solar cell 2900.

Figure 30A:
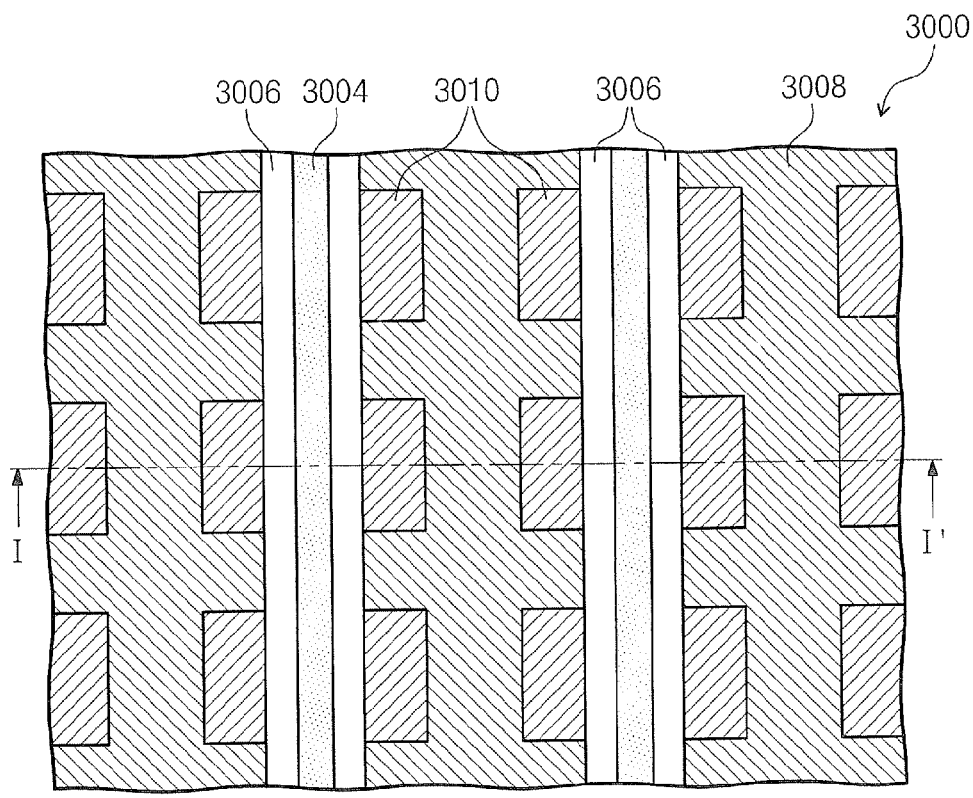
FIG. 30A is a plan view of an integrated circuit solar cell according to an embodiment of the present invention.
Figure 30B:
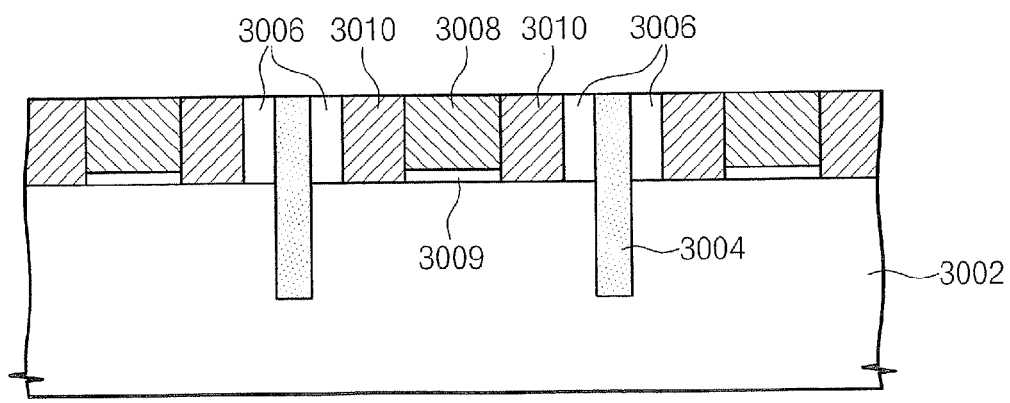
FIG. 30B is a cross-sectional view of the solar cell embodiment of FIG. 30A, taken along line I-I'.

FIG. 30A is a plan view of an integrated circuit solar cell 3000 according to an additional embodiment of the present invention and FIG. 30B is a cross-sectional view of the solar cell 3000 of FIG. 30A, taken along line I-I'. As illustrated by FIGS. 30A-30B, trench based electrodes 3004 extend as parallel-shaped stripes across a light receiving surface of the solar cell 3000. Each of these trench based electrodes 3004 is electrically connected to the substrate region 3002 and electrically isolated from the N-type regions 3010 by respective insulating spacers 3006. These N-type regions 3010 form respective P-N junctions with the underlying substrate region 3002 and electrically contact top surface electrodes 3008. Electrically insulating spacers 3009 are also provided beneath the top surface electrodes 3008 in order to isolate these electrodes 3008 from the underlying substrate region 3002.

Figure 31A:
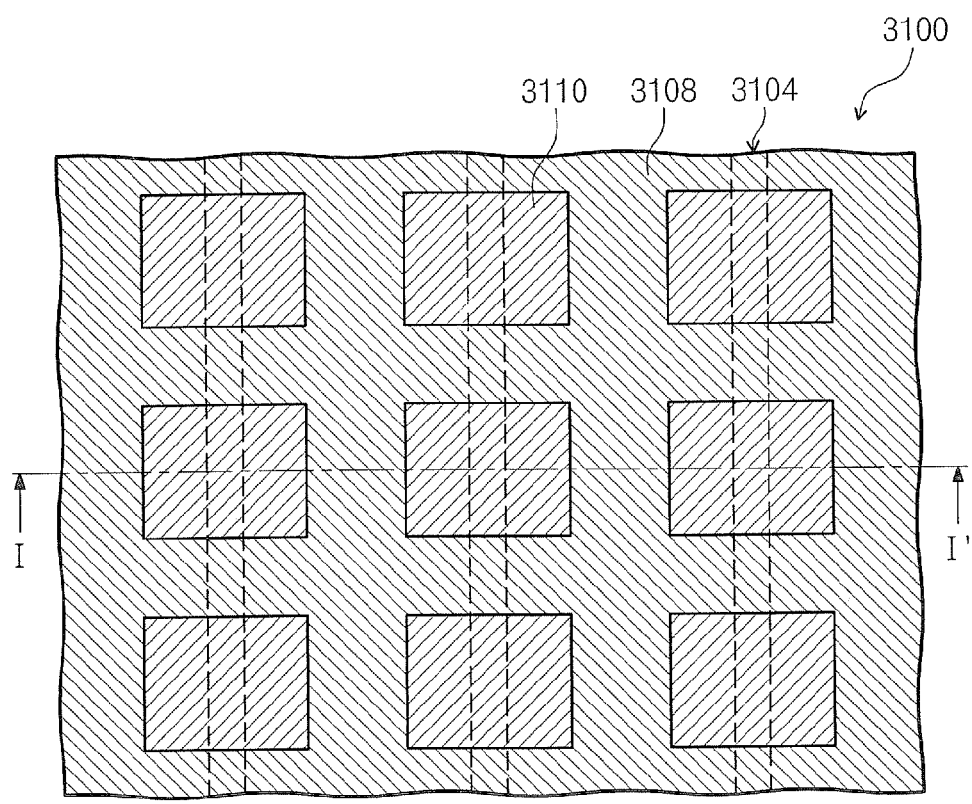
FIG. 31A is a plan view of an integrated circuit solar cell according to an embodiment of the present invention.
Figure 31B:
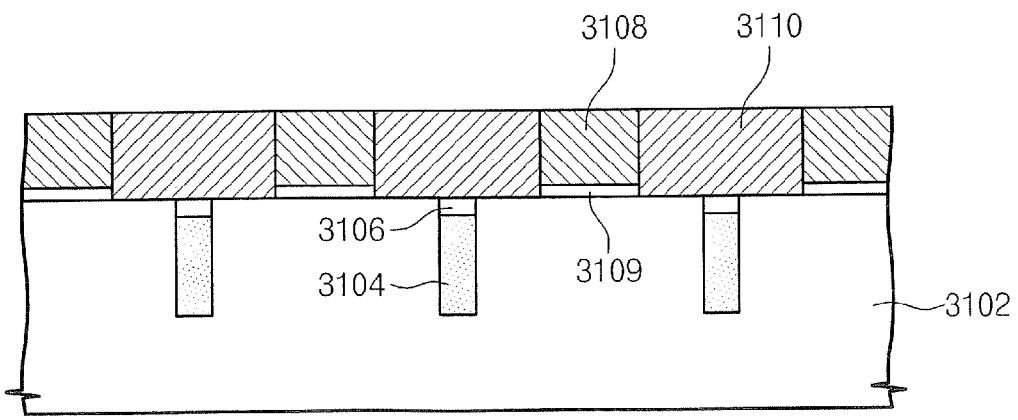
FIG. 31B is a cross-sectional view of the solar cell embodiment of FIG. 31A, taken along line I-I'.

FIG. 31A is a plan view of an integrated circuit solar cell 3100 according to another embodiment of the invention and FIG. 31B is a cross-sectional view of the solar cell 3100 of FIG. 31A, taken along line I-I'. This solar cell 3100 is illustrated as including a substrate region 3102 having a two-dimensional array of square N-type regions 3110 thereon that are surrounded by a mesh-shaped top surface electrode 3108. This top surface electrode 3108 is separated and isolated from the substrate region 3102 by electrically insulating spacers 3109, as illustrated. Stripe-shaped trench based electrodes 3104 are provided adjacent bottoms of respective trenches, as illustrated by FIG. 31B. These trench based electrodes 3104 are electrically connected to the substrate region 3102. Electrically insulating spacers 3106 are also provided between the trench based electrodes 3104 and the N-type regions 3110. External control can be made to the trench based electrodes 3104 using wire bonds (not shown in FIGS. 31A-31B) that are connected to a periphery of the substrate region 3102 (e.g., silicon wafer).

Figure 32A:
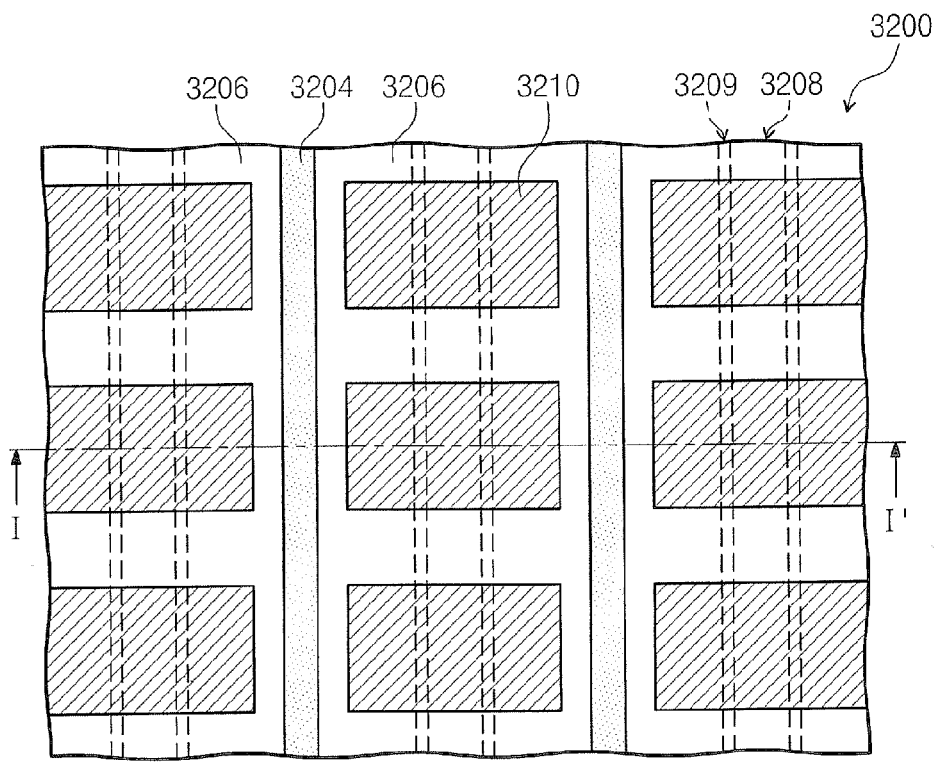
FIG. 32A is a plan view of an integrated circuit solar cell according to an embodiment of the present invention.
Figure 32B:
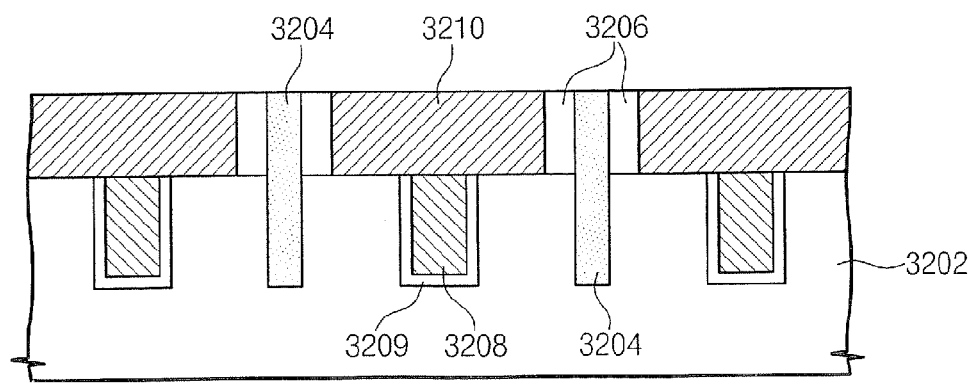
FIG. 32B is a cross-sectional view of the solar cell embodiment of FIG. 32A, taken along line I-I'.

FIG. 32A is a plan view of an integrated circuit solar cell 3200 according to another embodiment of the invention and FIG. 32B is a cross-sectional view of the solar cell 3200 of FIG. 32A, taken along line I-I'. This solar cell 3200 is illustrated as including a substrate region 3202 having a two-dimensional array of square N-type regions 3210 thereon that form respective P-N junctions with the substrate region 3202. A plurality of parallel stripe-shaped trench based electrodes 3208 are provided in respective trenches. These trench based electrodes 3208 are electrically connected to overlying N-type regions 3210, but electrically isolated from the surrounding substrate region 3202 by electrically insulating liners 3209 that extend along bottoms and sidewalls of the trenches, as illustrated. A plurality of parallel stripe-shaped trench electrodes 3204, which are electrically coupled to the substrate region 3202, are also provided in corresponding trenches, as illustrated. These electrodes 3204, which extend adjacent a light receiving surface of the solar cell 3200, are electrically isolated from the array of N-type regions 3210 by electrically insulating spacers 3206 (e.g., oxide spacers).

Figure 33:
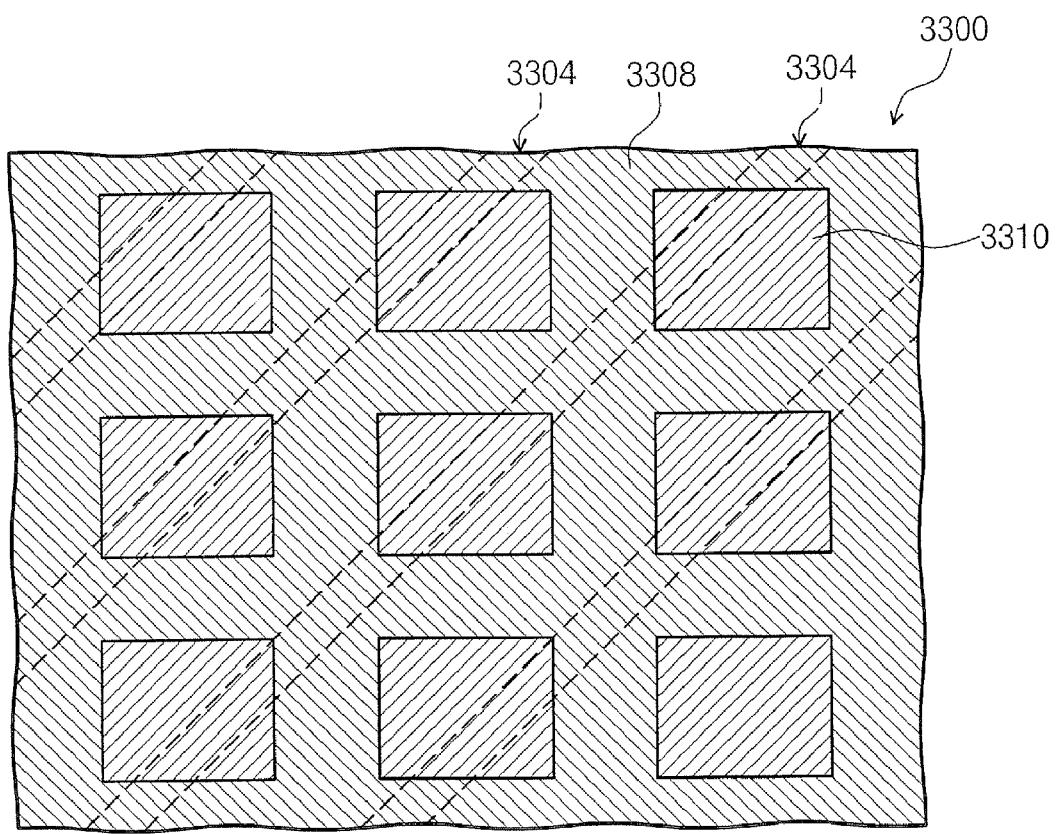
FIG. 33 is a plan view of an integrated circuit solar cell according to an embodiment of the present invention.

FIG. 33 is a plan view of an integrated circuit solar cell 3300 according to another embodiment of the invention, which is similar to the embodiment 3100 of FIGS. 31A-31B. This solar cell 3300 is illustrated as including a two-dimensional array of square N-type regions 3310 thereon that are surrounded by a mesh-shaped top surface electrode 3308. Parallel stripe-shaped trench based electrodes 3304 are also provided adjacent bottoms of respective trenches (not shown in FIG. 33). But, in contrast to the solar cell 3100 of FIGS. 31A-31B, the parallel stripe-shaped trench based electrodes 3304 extend at an angle relative to the electrodes 3104 of FIGS. 31A-31B.

Figure 34A:
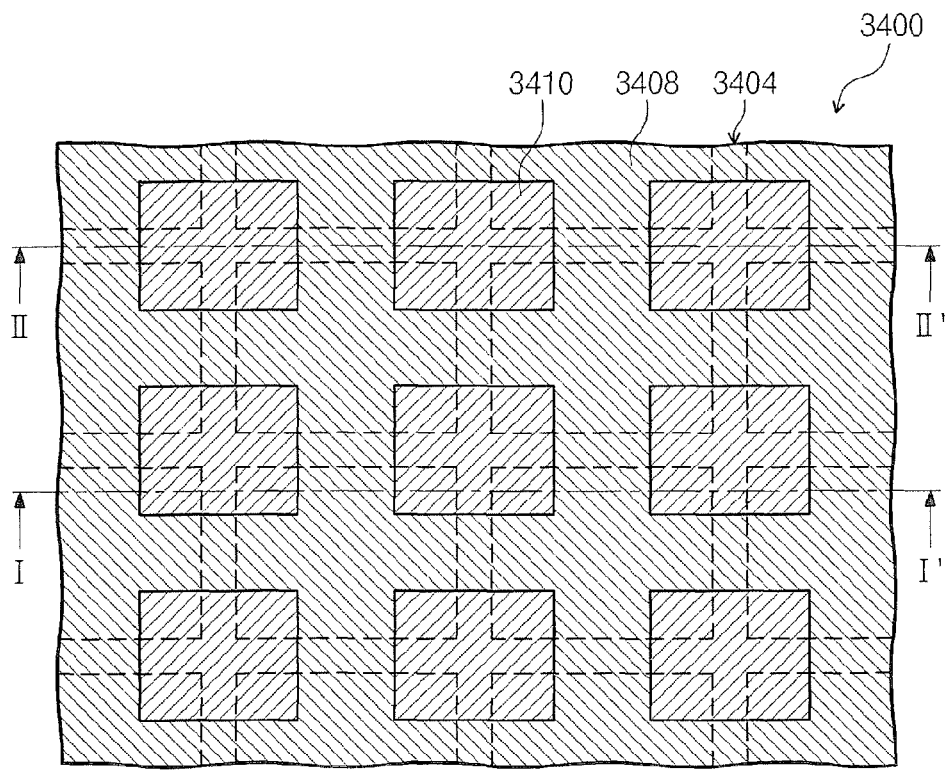
FIG. 34A is a plan view of an integrated circuit solar cell according to an embodiment of the present invention.
Figure 34B:
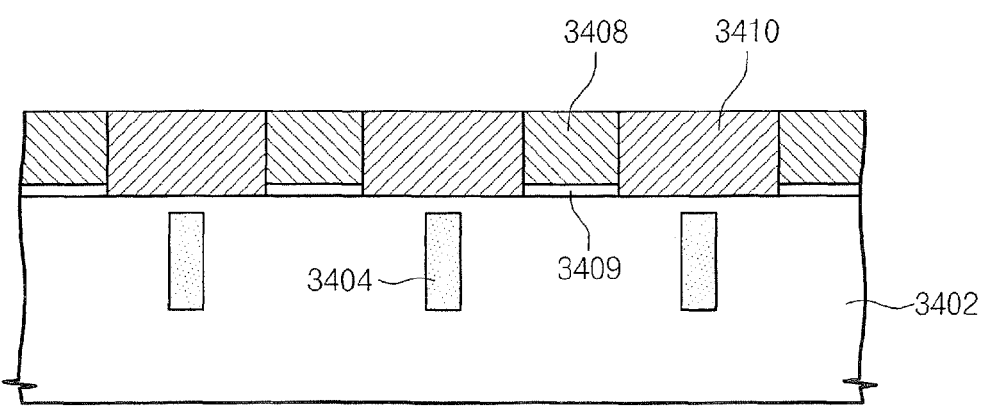
FIG. 34B is a cross-sectional view of the solar cell embodiment of FIG. 34A, taken along line I-I'.
Figure 34C:
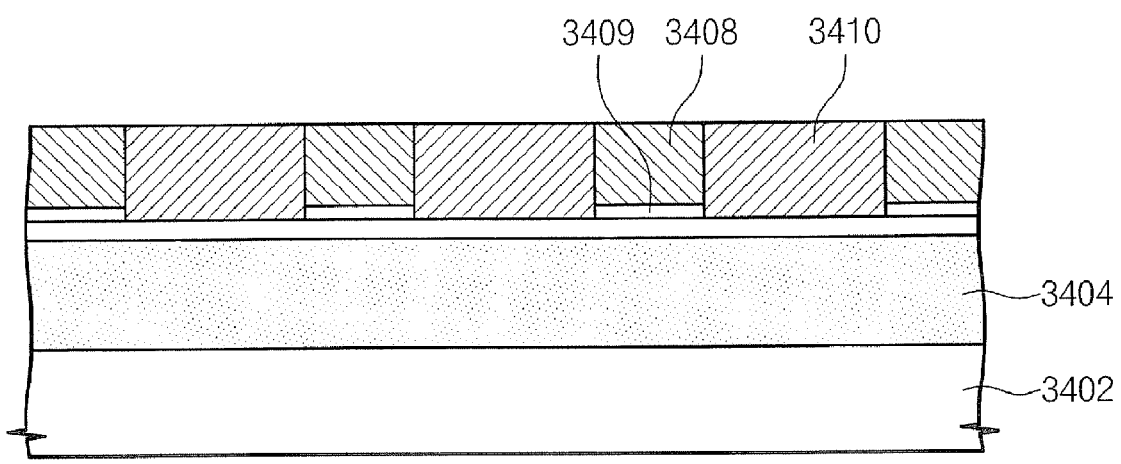
FIG. 34C is a cross-sectional view of the solar cell embodiment of FIG. 34A, taken along line II-II'.
Figure 35:
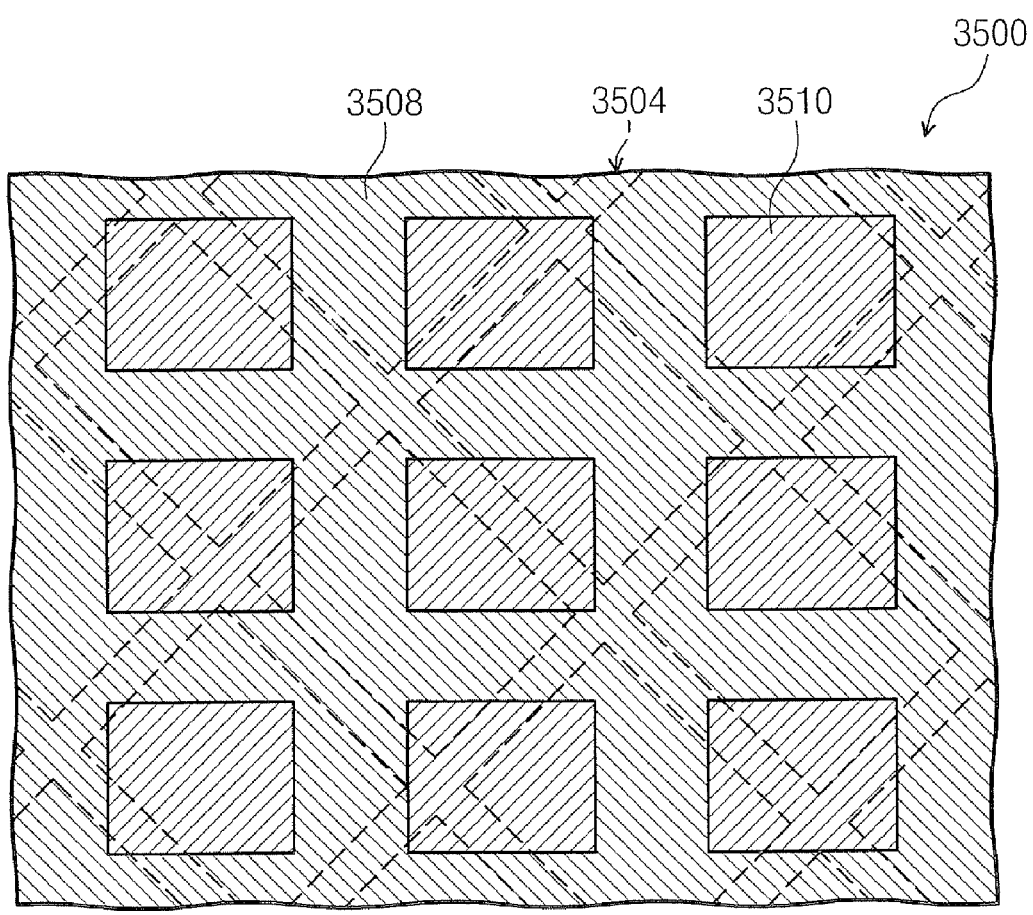
FIG. 35 is a plan view of an integrated circuit solar cell according to an embodiment of the present invention.

FIG. 34A is a plan view of an integrated circuit solar cell 3400 according to an additional embodiment of the present invention, FIG. 34B is a cross-sectional view of the solar cell embodiment of FIG. 34A, taken along line I-I', and FIG. 34C is a cross-sectional view of the solar cell embodiment of FIG. 34A, taken along line II-II'. Thus, as illustrated by FIGS. 34B-34C, a criss-crossing grid of trench-based electrodes 3404 are buried within a P-type substrate region 3402. This P-type substrate region 3402 forms respective P-N rectifying junctions with an array of square-shaped N-type regions 3410. A mesh-shaped electrode 3408 is also provided, which is electrically connected to the N-type regions 3410. This mesh-shaped electrode 3408 is electrically isolated from the substrate region 3402 by electrically insulating spacers 3409 (e.g., silicon dioxide spacers). FIG. 35 is a plan view of an integrated circuit solar cell 3500 according to an additional embodiment of the present invention, which is similar to the embodiment of FIGS. 34A-34C. As illustrated, a slanted criss-crossing grid of trench-based electrodes 3504 are buried within a P-type substrate region, which forms respective P-N rectifying junctions with an array of square-shaped N-type regions 3510. A mesh-shaped electrode 3508 is also provided, which is electrically connected to the N-type regions 3510.

Figure 36A:
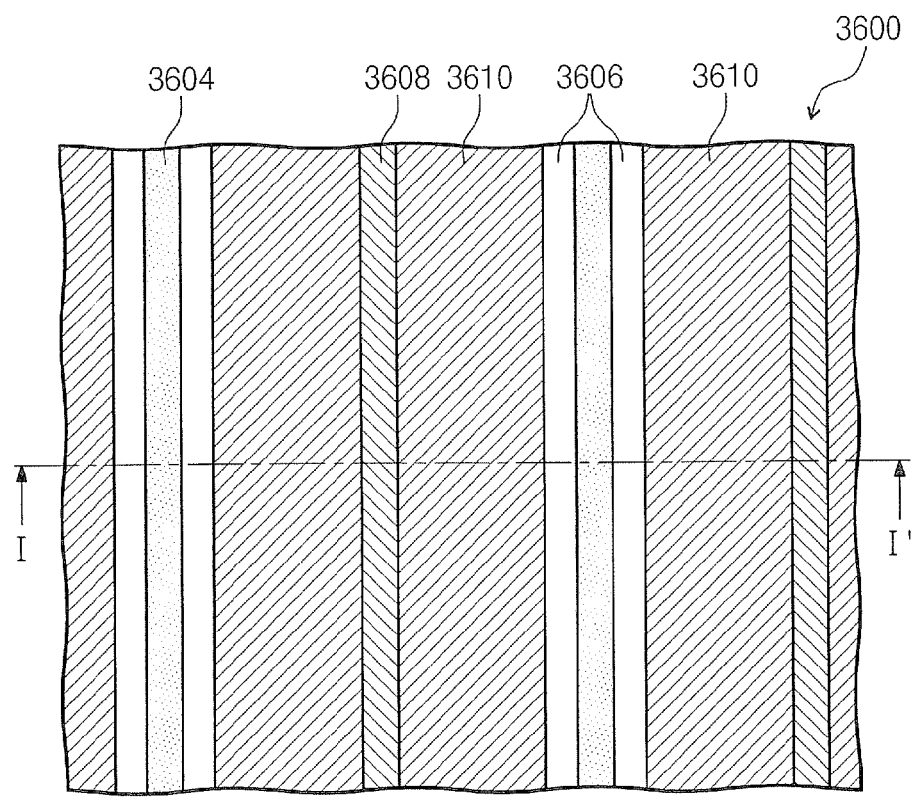
FIG. 36A is a plan view of an integrated circuit solar cell according to an embodiment of the present invention.
Figure 36B:
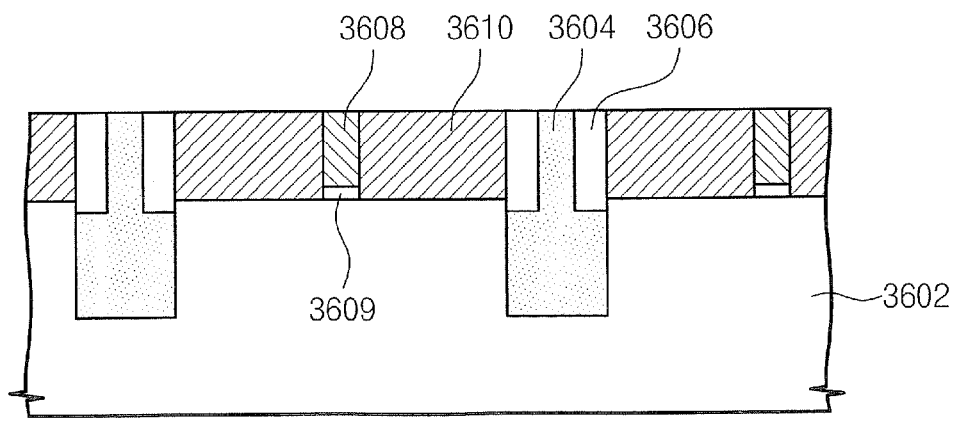
FIG. 36B is a cross-sectional view of the solar cell embodiment of FIG. 36A, taken along line I-I'.

FIG. 36A is plan view of a solar cell 3600 according to an additional embodiment of the invention and FIG. 36B is a cross-sectional view of the solar cell 3600 of FIG. 36A, taken along line I-I'. As illustrated by FIGS. 36A-36B, a plurality of relative thin stripe-shaped electrodes 3608 are provided on a light receiving surface of the solar cell 3600 alongside a plurality of stripe-shaped N-type regions 3610, which form respective P-N junctions with an underlying substrate region 3602 (e.g., P-type). These electrodes 3608 are electrically isolated from the underlying substrate region 3602 by electrically insulating spacers 3609 (e.g., oxide spacers). FIGS. 36A-36B also illustrate trench-based electrodes 3604 that extend in parallel with the N-type regions 3610 and the stripe-shaped electrodes 3608. These electrodes 3604, which are electrically connected to the substrate region 3602, are electrically isolated from adjacent N-type regions 3610 by electrically insulating spacers 3606.

Figure 37A:
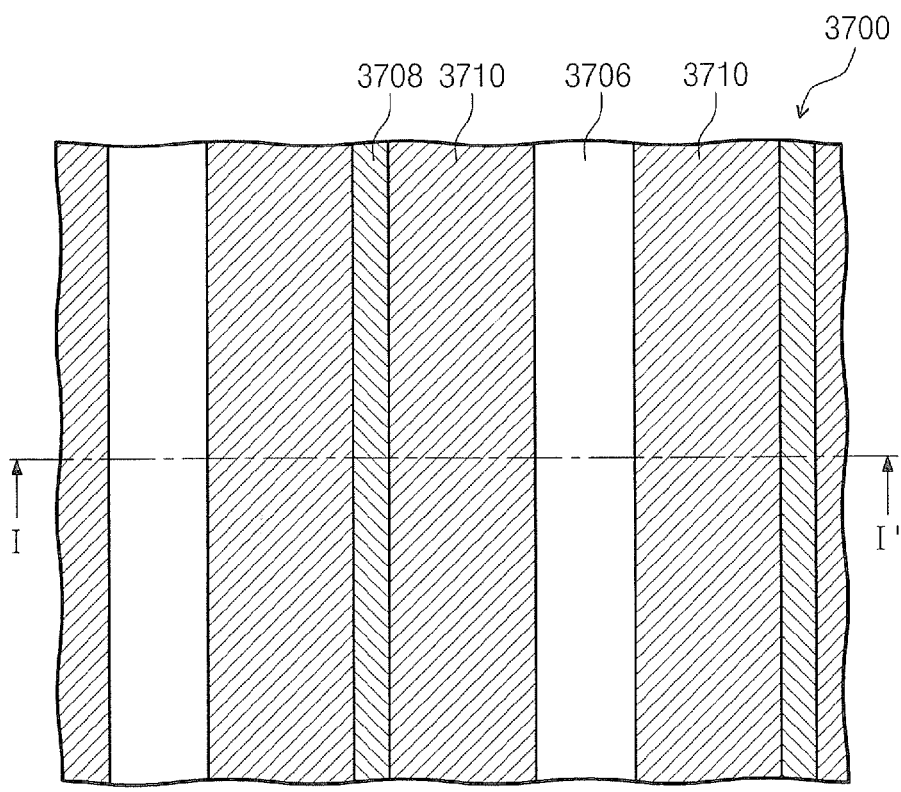
FIG. 37A is a plan view of an integrated circuit solar cell according to an embodiment of the present invention.
Figure 37B:
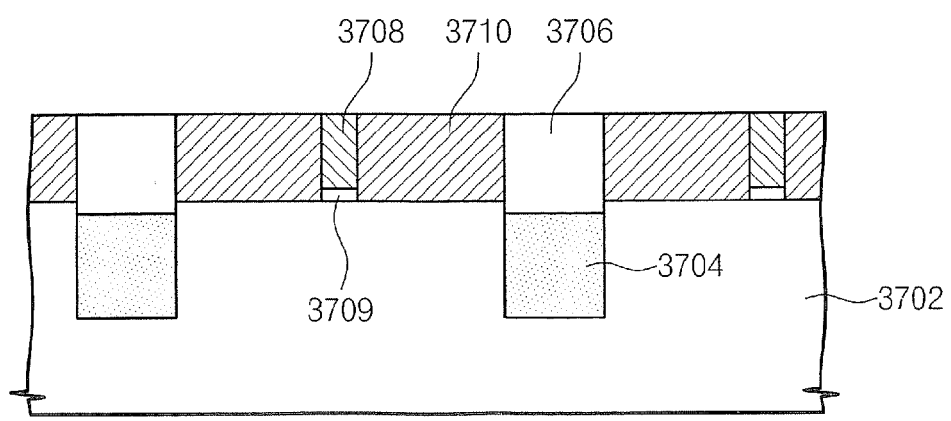
FIG. 37B is a cross-sectional view of the solar cell embodiment of FIG. 37A, taken along line I-I'.

FIG. 37A is plan view of a solar cell 3700 according to an additional embodiment of the invention and FIG. 37B is a cross-sectional view of the solar cell 3700 of FIG. 37A, taken along line I-I'. As illustrated by FIGS. 37A-37B, a plurality of relative thin stripe-shaped electrodes 3708 are provided on a light receiving surface of the solar cell 3700, with each electrode 3708 sandwiched between a pair of stripe-shaped N-type regions 3710, which form respective P-N junctions with an underlying substrate region 3702 (e.g., P-type). These electrodes 3708 are electrically isolated from the underlying substrate region 3702 by electrically insulating spacers 3709 (e.g., oxide spacers). FIGS. 37A-37B also illustrate trench-based electrodes 3704 that extend in parallel with the N-type regions 3710 and the stripe-shaped electrodes 3708. These electrodes 3704, which are electrically connected to the substrate region 3702, are electrically isolated from adjacent N-type regions 3710 by electrically insulating spacers 3706.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a solar cell, comprising:
    forming a semiconductor layer of second conductivity type on a semiconductor substrate having a base region of first conductivity therein;
    forming a first trench that extends through the semiconductor layer of second conductivity type and into the base region;
    forming trench sidewall spacers on sidewalls of the first trench;
    forming a second trench that extends through a bottom of the first trench and further into the base region; and
    filling the first trench and the second trench with a first electrode electrically coupled to the base region.

2. The method of claim 1, wherein forming a first trench is preceded by forming a boundary layer of second conductivity type in the base region by diffusing a sufficient quantity of second conductivity type dopants from the semiconductor layer into the base region to thereby convert a portion of the base region to second conductivity type.

3. The method of claim 2, wherein the semiconductor layer of second conductivity type forms an heterojunction with the boundary layer.

4. The method of claim 1, wherein filling the second trench is preceded by implanting dopants of first conductivity type into the bottom of the second trench.

5. The method of claim 1, further comprising forming a second electrode in contact with the semiconductor layer of second conductivity type.

6. The method of claim 1, wherein the semiconductor layer of second conductivity type forms an heterojunction with the semiconductor substrate.

7. The method of claim 1, wherein forming a first trench is preceded by forming an anti-reflective layer on the semiconductor layer of second conductivity type.

8. The method of claim 1, wherein forming a semiconductor layer of second conductivity type comprises forming a semiconductor layer of second conductivity type on a surface of a semiconductor substrate having a non-uniform surface profile with localized peaks and valleys therein.

9. The method of claim 1, wherein forming a semiconductor layer of second conductivity type comprises forming an amorphous silicon layer of second conductivity type on a surface of a semiconductor substrate having a non-uniform surface profile with localized peaks and valleys therein.

10. The method of claim 9, wherein forming a first trench is preceded by forming a boundary layer of second conductivity type in the base region by diffusing a sufficient quantity of second conductivity type dopants from the semiconductor layer into the base region to thereby convert a portion of the base region from first conductivity type to second conductivity type.

11. A method of forming a solar cell, comprising:
    texturizing a surface of a silicon wafer having a base region of first conductivity type therein to generate localized peaks and valleys in the surface;
    depositing an in-situ doped amorphous silicon layer of second conductivity type onto the textured surface to thereby define a textured rectifying heterojunction therewith;
    forming a boundary layer of second conductivity type in the base region by diffusing a sufficient quantity of second conductivity type dopants from the amorphous silicon layer into the base region to thereby convert a portion of the base region from net first conductivity type to net second conductivity type;

forming a trench that extends through the amorphous silicon layer and the boundary layer and into the base region;

forming a first electrode electrically coupled to the amorphous silicon layer; and forming a second electrode electrically coupled to the base region adjacent a bottom of the trench.

12. The method of claim 11, wherein texturizing comprises etching the surface of the silicon wafer by exposing the surface to an etchant that causes the formation of residues on the surface that act as localized etching masks to further etching.

13. The method of claim 12, wherein texturizing comprises exposing the surface to a dry etchant comprising chlorine and fluorine.

14. The method of claim 11, wherein forming a boundary layer of second conductivity type in the base region comprises forming a boundary layer having a thickness in a range from about 500 Å to about 2000 Å.

15. The method of claim 14, wherein forming a boundary layer of second conductivity type in the base region comprises annealing the amorphous silicon layer at a temperature in a range between about 500° C. and about 900° C.

16. The method of claim 14, wherein depositing an in-site doped amorphous silicon layer comprises depositing an in-site doped amorphous silicon layer of second conductivity type having a doping concentration therein in a range from about $1 \times 10^{19}$ cm$^3$ to about $1 \times 10^{21}$ cm$^3$.

17. The method of claim 14, wherein depositing an in-situ doped amorphous silicon layer comprises depositing an in-site doped amorphous silicon layer of second conductivity type using a low pressure chemical vapor Deposition (LPCVD) technique.

18. The method of claim 11, wherein forming a second electrode comprises depositing a second electrode at the bottom of the trench; and wherein forming a first electrode comprises depositing a first electrode adjacent to a top of the trench.

19. The method of claim 18, wherein forming a first electrode is preceded by covering the second electrode with an electrically insulating separating layer extending between sidewalls of the trench.

20. The method of claim 18, wherein forming a trench comprises forming a grid-shaped trench having a plurality of criss-crossing grooves therein that extend across the silicon wafer.

21. The method of claim 18, wherein the grid-shaped trench comprises an outermost ring-shaped trench adjacent a perimeter of the silicon wafer; and wherein forming a first electrode is followed by selectively removing a portion of the first electrode and an underlying portion of the electrically insulating separating layer in the ring-shaped trench to thereby expose the second electrode.

22. The method of claim 21, wherein depositing a second electrode at the bottom of the trench is preceded by implanting dopants of first conductivity type into the bottom of the trench.

23. The method of claim 21, further comprising forming a plurality of wire bonds to exposed portions of the second electrode within the ring-shaped trench.

* * * * *